(12) United States Patent
Lu et al.

(10) Patent No.: US 11,404,555 B2
(45) Date of Patent: Aug. 2, 2022

(54) METAL GATES AND MANUFACTURING METHODS THEREOF

(71) Applicant: Taiwan Semiconductor Manufacturing Co., Ltd., Hsin-Chu (TW)

(72) Inventors: Jen-Hsiang Lu, Taipei (TW); Tsung-Han Tsai, Kaohsiung (TW); Shih-Hsun Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 94 days.

(21) Appl. No.: 16/865,640

(22) Filed: May 4, 2020

(65) Prior Publication Data

US 2020/0266282 A1    Aug. 20, 2020

Related U.S. Application Data

(63) Continuation of application No. 16/008,920, filed on Jun. 14, 2018, now Pat. No. 10,644,125.

(51) Int. Cl.
  *H01L 29/51* (2006.01)
  *H01L 29/45* (2006.01)
  (Continued)

(52) U.S. Cl.
  CPC ...... *H01L 29/517* (2013.01); *H01L 21/02362* (2013.01); *H01L 21/32132* (2013.01);
  (Continued)

(58) Field of Classification Search
  CPC ............ H01L 29/517; H01L 21/02362; H01L 21/32132; H01L 21/32139; H01L 29/456; H01L 29/518; H01L 29/665; H01L 29/66545; H01L 29/6656; H01L 21/28114; H01L 29/0847; H01L 29/42376; H01L 29/4958; H01L 29/4966; H01L 29/7848; H01L 29/42368; H01L 29/513; H01L 29/66795; H01L 29/785; H01L 29/42364; H01L 29/42372; H01L 29/495

See application file for complete search history.

(56) References Cited

U.S. PATENT DOCUMENTS 7,732,346 B2   6/2010   Hsu et al.
8,048,733 B2   11/2011  Yeh et al.
(Continued)

*Primary Examiner* — Su C Kim
(74) *Attorney, Agent, or Firm* — Haynes and Boone, LLP

(57) ABSTRACT

A semiconductor structure includes a high-k metal gate structure (HKMG) disposed over a channel region of a semiconductor layer formed over a substrate, where the HKMG includes an interfacial layer disposed over the semiconductor layer, a high-k dielectric layer disposed over the interfacial layer, and a gate electrode disposed over the high-k dielectric layer, where a length of the high-k dielectric layer is greater than a length of the gate electrode and where outer edges of the interfacial layer, the high-k dielectric layer, and the gate electrode form a step profile. The semiconductor structure further includes gate spacers having sidewall portions contacting sidewalls of the gate electrode and bottom portions contacting top portions of the high-k dielectric layer and the interfacial layer, and source/drain features disposed in the semiconductor layer adjacent to the HKMG.

20 Claims, 15 Drawing Sheets

(51) Int. Cl.
*H01L 29/66* (2006.01)
*H01L 21/3213* (2006.01)
*H01L 21/02* (2006.01)

(52) U.S. Cl.
CPC ...... *H01L 21/32139* (2013.01); *H01L 29/456* (2013.01); *H01L 29/518* (2013.01); *H01L 29/665* (2013.01); *H01L 29/6656* (2013.01); *H01L 29/66545* (2013.01)

(56) References Cited

U.S. PATENT DOCUMENTS

| | | | |
|---|---|---|---|
| 8,361,855 B2 | 1/2013 | Yeh et al. | |
| 8,415,254 B2 | 4/2013 | Yeh et al. | |
| 8,487,378 B2 | 7/2013 | Goto et al. | |
| 8,586,436 B2 | 11/2013 | Ng et al. | |
| 8,729,634 B2 | 5/2014 | Shen et al. | |
| 8,826,213 B1 | 9/2014 | Ho et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,887,106 B2 | 11/2014 | Ho et al. | |
| 8,943,455 B2 | 1/2015 | Chen et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,337,192 B2 | 5/2016 | JangJian et al. | |
| 9,431,304 B2 | 8/2016 | Huang et al. | |
| 9,461,144 B2 | 10/2016 | Yeh et al. | |
| 9,520,482 B1 | 12/2016 | Chang et al. | |
| 9,576,814 B2 | 2/2017 | Wu et al. | |
| 9,659,786 B2 | 5/2017 | Greene et al. | |
| 9,761,684 B2 | 9/2017 | Huang et al. | |
| 10,276,676 B1 | 4/2019 | Liang et al. | |
| 10,529,629 B2 | 1/2020 | Huang et al. | |
| 10,644,125 B2 * | 5/2020 | Lu | H01L 29/0847 |
| 2003/0235943 A1 * | 12/2003 | Trivedi | H01L 29/6659 438/197 |
| 2010/0065925 A1 | 3/2010 | Huang et al. | |
| 2011/0020994 A1 | 1/2011 | Lin et al. | |
| 2013/0075831 A1 | 3/2013 | JangJian et al. | |
| 2013/0119487 A1 * | 5/2013 | Lin | H01L 21/28114 257/412 |
| 2014/0282326 A1 | 9/2014 | Chen et al. | |
| 2015/0380407 A1 | 12/2015 | Ji et al. | |

\* cited by examiner

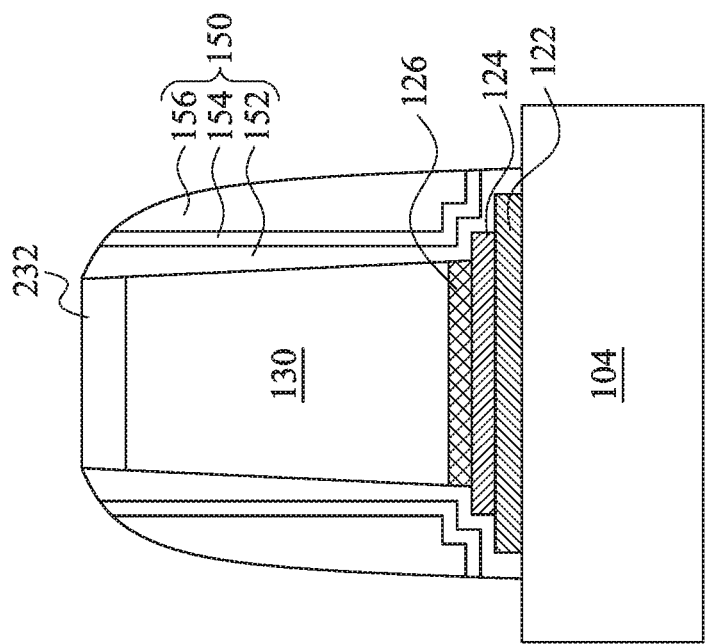
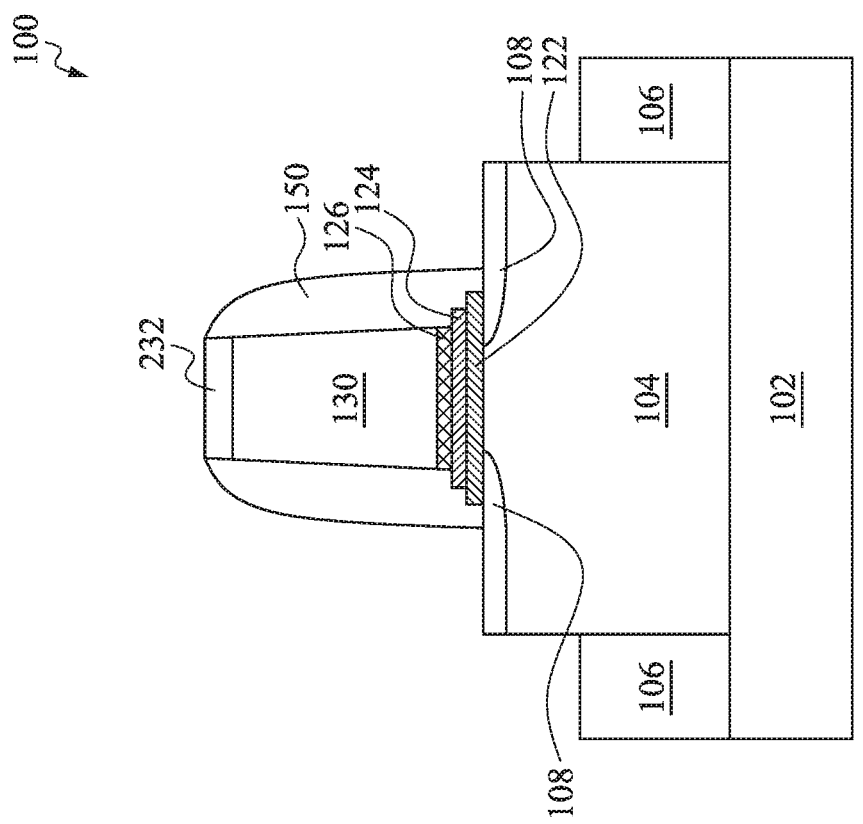
Fig. 10A
Fig. 10B

METAL GATES AND MANUFACTURING METHODS THEREOF

CROSS-REFERENCE TO RELATED APPLICATIONS

This is a continuation application of and claims priority to U.S. patent application Ser. No. 16/008,920 filed on Jun. 14, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, device performance can be improved by using a high-k metal gate structure (HKMG) instead of a polysilicon gate. While existing methods have generally been adequate, challenges remain in implementing such method, especially with respect to forming multiple conductive layers in the HKMG when feature sizes (e.g., gate lengths) continue to decrease.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8A, 8B, 9, 10A, 10B, 11, 12, 13, 14, 15, and 16 illustrate cross-sectional views of a semiconductor structure during intermediate steps of implementing an embodiment of the method illustrated in FIGS. 2A and 2B according to one or more embodiments of the present disclosure.

DETAILED DESCRIPTION

Figure 1B:
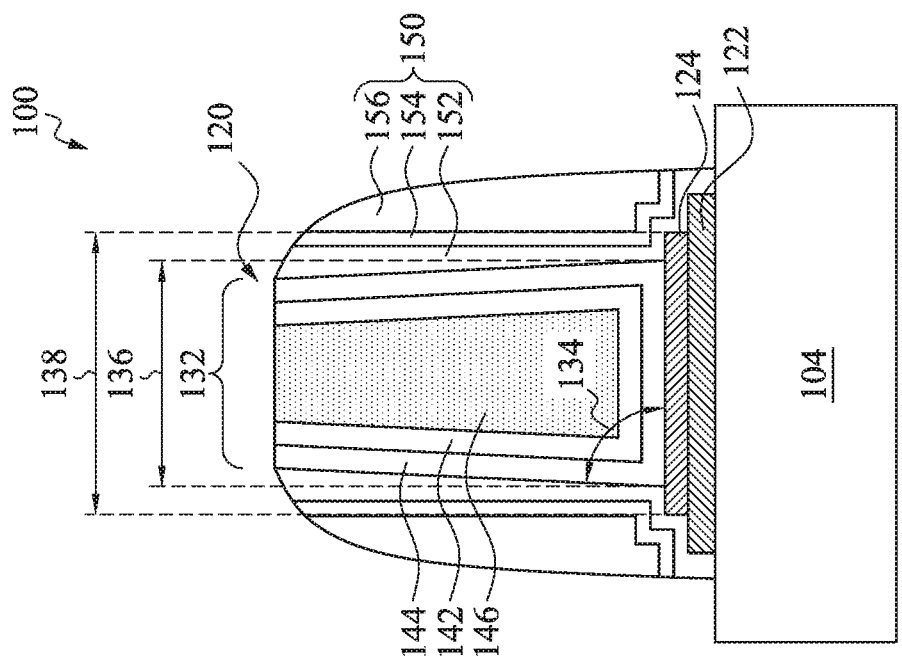
FIGS. 1A and 1B illustrate cross-sectional views of a semiconductor structure taken in the X-Z plane according to one or more embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices and fabrication methods, and more particularly to fabricating high-k metal gates in semiconductor devices.

Replacing polysilicon gates (or dummy gates) with high-k (i.e., dielectric material with a dielectric constant higher than that of silicon dioxide) metal gates (HKMG) have brought about improvements in device performance as feature sizes continue to decrease. Although methods of implementing HKMG process have been generally adequate, they have not been entirely satisfactory in all aspects. In one example, challenges remain with respect to forming multiple conductive layers in a HKMG when gate length shrinks due to reduced features sizes. For a "high-k last" process during which a dummy gate is first formed to act as a placeholder for the HKMG and subsequently removed after other components of the device are fabricated, portions of a high-k dielectric of the HKMG are formed along sidewalls of a gate trench, reducing the space available for forming the conductive layers. Additionally, because formation of a silicide layer over source/drain features of the device is generally postponed to after the deposition of an interlayer dielectric layer and the formation of S/D contact holes, the size of the silicide layer may be limited. The present disclosure provides structures of HKMG and methods of forming the same aimed to enhance the processing window for forming multiple conductive layers in an HKMG and to improve device performance by enlarging the contact area between a silicide layer and source/drain features of the device.

Figure 1A:
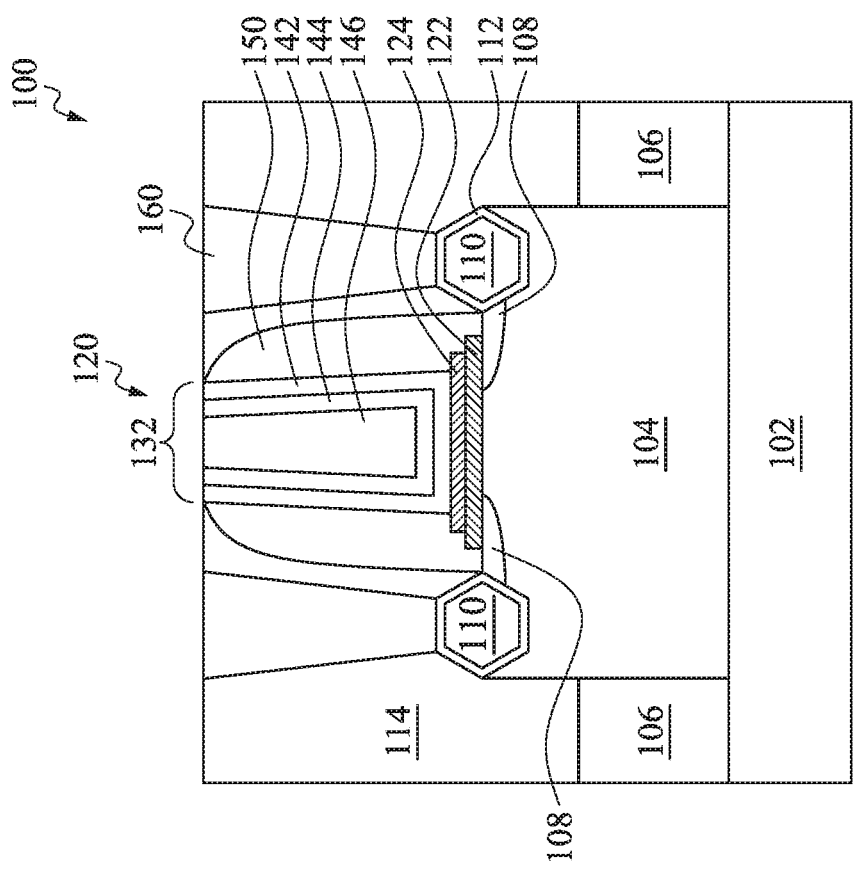
Figure 1D:
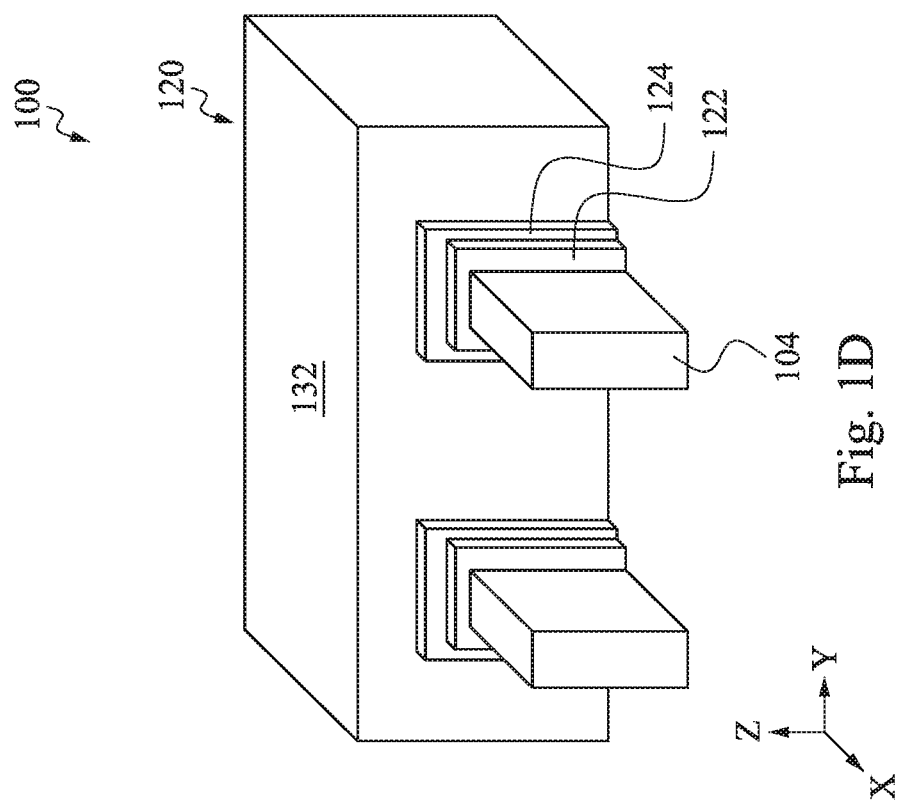
FIG. 1D shows a three-dimensional perspective view of the semiconductor structure of FIG. 1C according to one or more embodiments of the present disclosure.
Figure 1C:
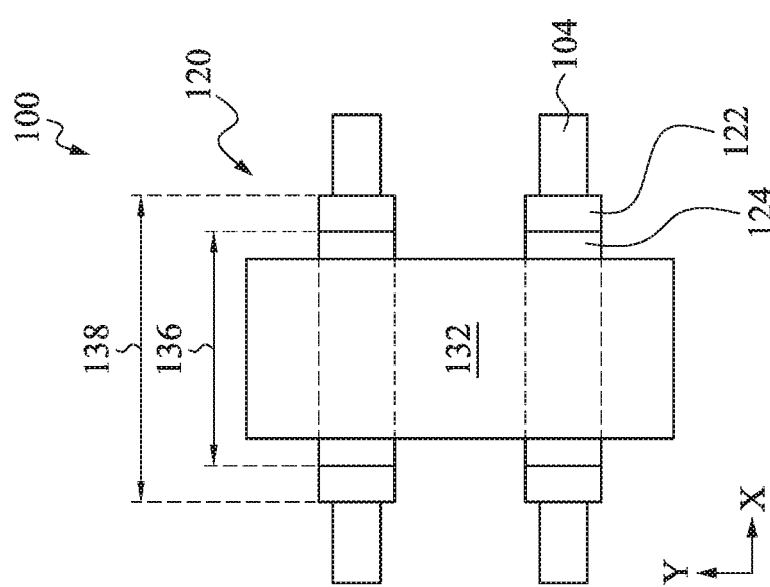
FIG. 1C shows a top view of the semiconductor structure of FIG. 1A taken in the X-Y plane according to one or more embodiments of the present disclosure.
Figure 1E:
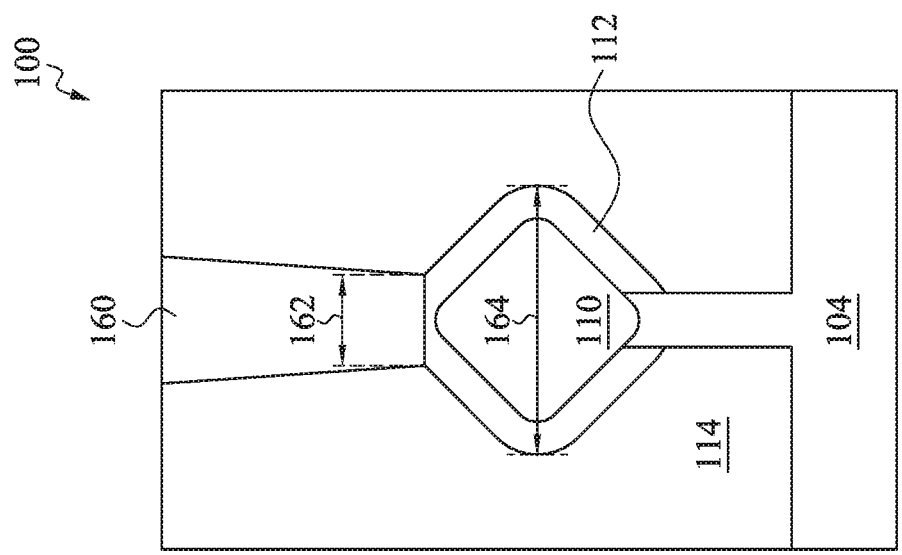
FIG. 1E shows a cross-sectional view of the semiconductor structure of FIG. 1A taken in the Y-Z plane according to one or more embodiments of the present disclosure.
Figure 1E:
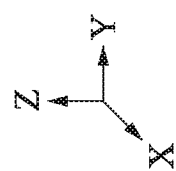
Figure 2A:
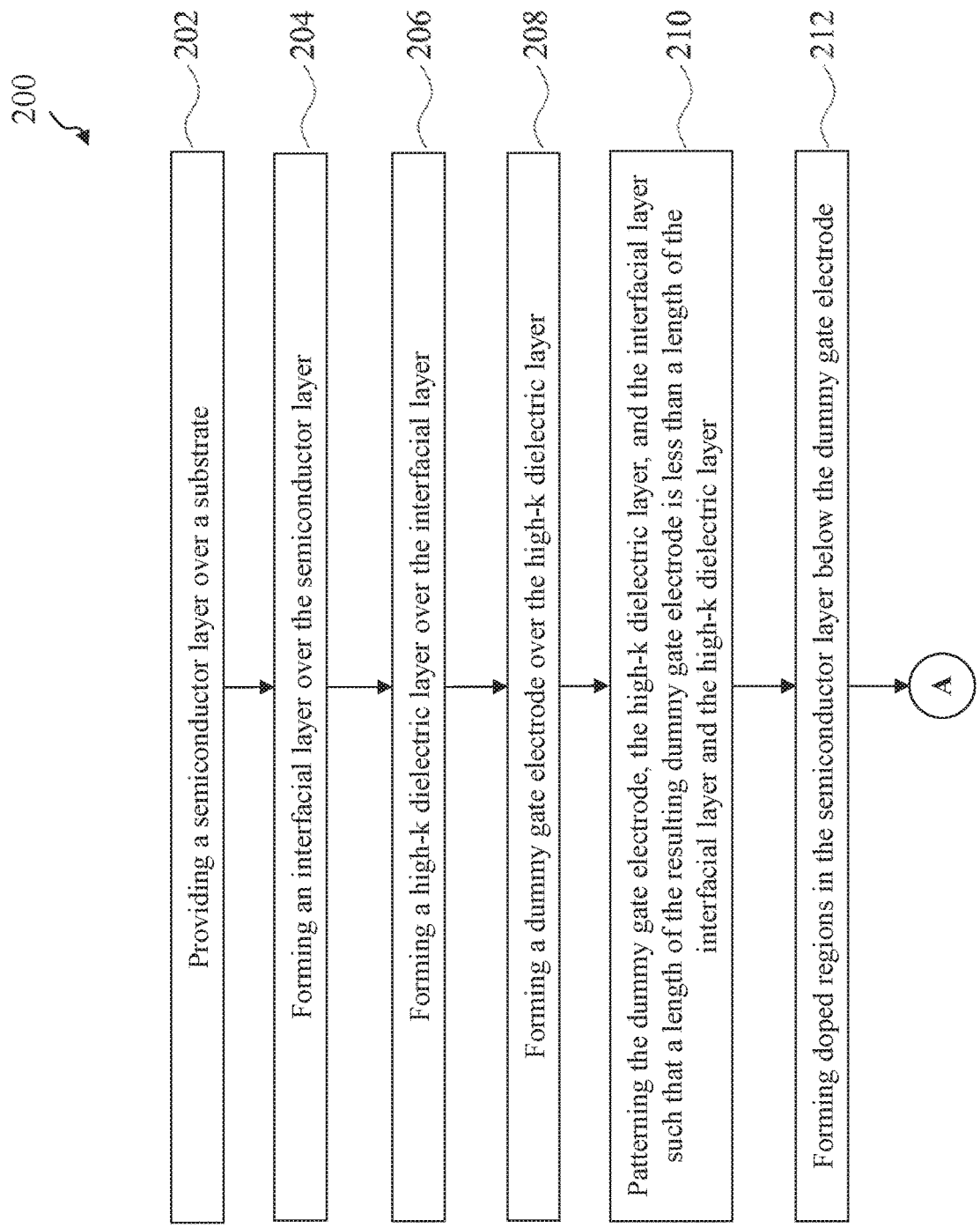
FIGS. 2A and 2B illustrate a flow chart of a method for forming a semiconductor structure according to one or more embodiments of the present disclosure.
Figure 2B:
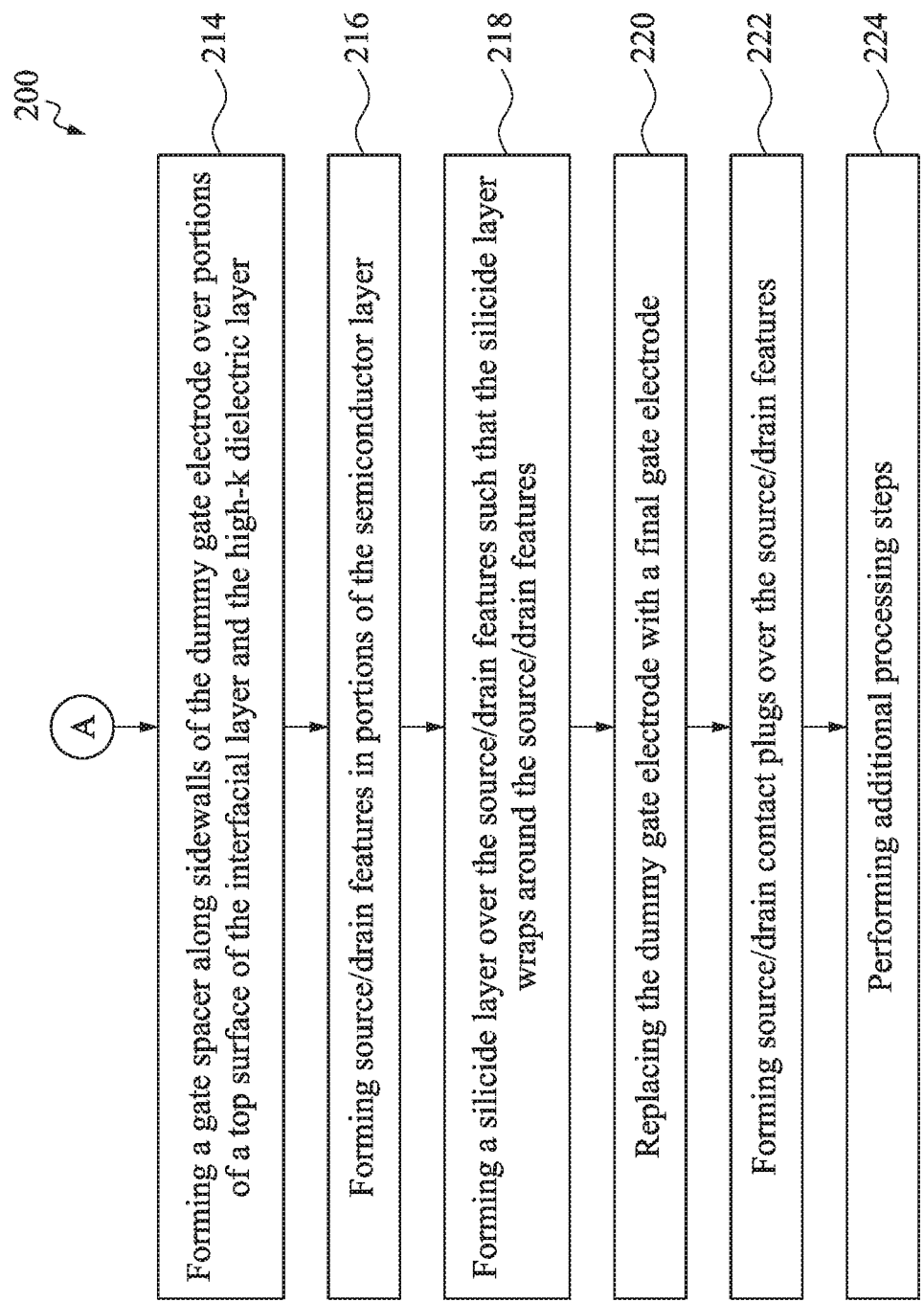

FIG. 1A illustrates a cross-sectional view of a portion of a semiconductor device (or device) 100 in the X-Z plane. FIG. 1B illustrates an enlarged view of a portion of the device 100 illustrated in FIG. 1A. FIG. 1C illustrates a top view of a portion of the device 100 in the X-Y plane, where the device 100 includes fins for forming fin-like field effect transistors (FinFETs). FIG. 1D illustrates a three-dimensional perspective view of the device 100 as illustrated in FIG. 1D. FIG. 1E illustrates a cross-sectional view of a portion of the device 100 in the Y-Z plane. FIGS. 2A and 2B illustrate an example method 200 for fabricating the device 100. FIGS. 3-16 illustrate the cross-sectional views of the portion of the device 100 illustrated in FIG. 1A in the X-Z plane during various fabrication steps of an embodiment of the method 200. The device 100 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, the device 100 may be a FinFET device having a semiconductor fin protruding out of a substrate as illustrated herein, or alternatively, the device 100 may be a planar FET device.

Referring to FIG. 1A, the device 100 includes a substrate 102, a semiconductor layer 104 (e.g., a semiconductor fin) protruding out of the substrate 102, doped regions 108 disposed in the semiconductor layer 104, an isolation structure 106 over the substrate 102 and adjacent to the semiconductor layer 104, a high-k metal gate structure (HKMG) 120 engaging the semiconductor layer 104 in a channel region, source/drain features 110 disposed over the semiconductor layer 104 and on opposite sides of the HKMG 120, a silicide layer 112 disposed on surfaces of the source/drain features 110, gate spacer 150 disposed along sidewalls of the HKMG 120, an interlayer dielectric (ILD) layer 114 disposed over the isolation structure 106 and the other various components of the device 100, and source/drain contact plugs (or contact plugs) 160 disposed in the ILD layer 114 and contacting the source/drain features 110. In at least one embodiment, the HKMG 120 is oriented lengthwise along direction Y and includes an interfacial layer 122 disposed over the semiconductor layer 104, a high-k dielectric layer 124 disposed over the interfacial layer 122, and a gate electrode 132 including one or more work function metal layers (e.g., two work function metal layers are illustrated as 142 and 144) and a bulk conductive layer 146. In many embodiments, the device 100 includes additional features not depicted in FIG. 1A. Each component of the device 100 will be discussed in detail below.

The substrate 102 may include any suitable semiconductor materials, such as silicon; germanium; a compound semiconductor, such as silicon carbide, gallium arsenic, gallium phosphide, indium phosphide, indium arsenide, and/or indium antimonide; an alloy semiconductor such as SiGe, GaAsP, AnnAs, AlGaAs, GaInAs, GaInP, and/or GaInAsP; other suitable materials, or combinations thereof.

The substrate 102 may be a single-layer material having a uniform composition, such as a bulk silicon substrate. Alternatively, the substrate 102 may include multiple material layers having similar or different compositions suitable for IC device manufacturing. In one example, the substrate 102 may be a silicon-on-insulator (SOI) substrate having a semiconductor silicon layer formed on a silicon oxide layer.

The semiconductor layer 104 may be configured to provide an n-type FET device or a p-type FET device depending upon specific design requirements for the device 100. In some embodiments, the semiconductor layer 104 is configured to provide an n-well structure, a p-well structure, or, as depicted herein, a raised structure such as an active fin protruding out of the substrate 102. The semiconductor layer 104 may include one or more semiconductor materials such as silicon, germanium, silicon carbide, gallium arsenic, gallium phosphide, indium phosphide, indium arsenide, indium antimonide, SiGe, GaAsP, AnnAs, AlGaAs, GaInAs, GaInP, and/or GaInAsPIn, and/or other suitable materials. In some embodiments, the semiconductor layer 104 includes the same material(s) as the substrate 102. In some embodiments, the semiconductor layer 104 includes alternately stacked layers of two different semiconductor materials, such as layers of silicon and SiGe alternately stacked. In at least one embodiment, the semiconductor layer 104 includes doped regions (e.g., lightly doped drain (LDD) regions or source/drain extension regions) 108 for improving certain performance of the device 100. The doped regions 108 may be doped with n-type dopants, such as phosphorus or arsenic, or p-type dopants, such as boron or $BF_2$, depending on design requirements for the device 100.

The isolation structure 106 is configured to electrically isolate the semiconductor layer 104 from other active regions and may include silicon oxide, silicon nitride, silicon oxynitride, fluoride-doped silicate glass (FSG), a low-k dielectric material, other suitable dielectric materials, or combinations thereof. The isolation structure 106 may be shallow trench isolation (STI) features. The isolation structure 106 may additionally or alternatively include field oxide, local oxidation of silicon (LOCOS), other suitable structures, or combinations thereof. The isolation structure 106 may be a multi-layer structure, for example, having a thermal oxide liner layer adjacent to the semiconductor layer 104 and other insulating material(s) over the liner layer.

Referring to FIGS. 1A and 1B, the HKMG 120 engages the semiconductor layer 104 in the channel region (not shown) interposing the source/drain features 110. In an embodiment, the HKMG 120 includes a high-k gate dielectric layer (or a high-k dielectric layer) 124 disposed over the semiconductor layer 104 and a gate electrode 132 disposed over the high-k dielectric layer 124 and including multiple conductive layers, such as work function metal layers 142 and 144, and bulk conductive layer 146. In an embodiment, the HKMG 120 additionally includes an interfacial layer 122 formed between the semiconductor layer 104 and the high-k dielectric layer 124. The HKMG 120 may additionally include numerous other layers, such as capping layers, diffusion layers, barrier layers, hard mask layers, other suitable material layers, or combinations thereof.

Referring to FIG. 1B, in an embodiment, the interfacial layer 122 and the high-k dielectric layer 124 are disposed on the semiconductor layer 104 but not disposed along sidewalls of the gate spacer 150. The work function metal layer 142, on the other hand, includes a bottom portion disposed over the high-k dielectric layer 124 and sidewall portions disposed along and in direct contact with the gate spacer 150. In an embodiment, the gate electrode 132 is configured to have slanted sidewalls, forming an acute angle (i.e., an angle of less than 90 degrees) 134 with the top surface of the high-k dielectric layer 124.

Still referring to FIG. 1B and further to FIGS. 1C and 1D, outer edges of the high-k dielectric layer 124 and the interfacial layer 122 extend beyond outer edges of the gate electrode 132 (i.e., outer edges of the work function metal layer 142), such that the gate electrode 132 and the high-k dielectric layer 124 form a step profile as illustrated in FIG. 1B. In other words, the high-k dielectric layer 124 is configured to form a footing profile with respect to the bottom portion of the gate electrode 132. In an embodiment, a width 136 of the gate electrode 132 is less than a width 138 of the high-k dielectric layer 124 along direction X. Furthermore, in some embodiments, a width of the interfacial layer 122 is greater than the width 138; however, the present disclosure is equally applicable to embodiments in which the width of the interfacial layer is equal to the width 138.

The footing profile formed by the high-k dielectric layer 124 offers many benefits. In one example, the extension of the high-k dielectric layer 124 beyond the outer edges of the gate electrode 132 increases a width of the HKMG 120 (or of the channel region thereunder) along direction X, thereby forming or enlarging an overlapping area between the doped regions 108 and the HKMG 120. Additionally, the extension of the high-k dielectric layer 124 may produce fringe electric field under the HKMG 120 that may also improve the device performance. On the contrary, if the high-k dielectric layer 124 does not extend beyond the outer edges of the gate electrode 132, the subsequently formed gate spacer 150 may leave residue under the HKMG 120, thereby damaging the device performance due to dielectric breakdown. In many embodiments, the extension of the high-k dielectric layer 124 beyond the outer edges of the gate electrode 132 is about 5% to about 15% of the width 136. If such extension is below about 5%, the enlargement of the overlapping area would not be significant for the enhancement of the device performance, and if the extension is greater than 15%, the subsequently formed gate spacer 150 would not have sufficient width to cover the extended portions of the high-k dielectric layer 124, leading to potential loss of the high-k dielectric layer 124 during a subsequent wet etching process.

In an embodiment, the interfacial layer 122 includes silicon oxide, silicon oxynitride, other suitable dielectric materials, or combinations thereof. The high-k dielectric layer 124 may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), other suitable high-k dielectric materials, or combinations thereof.

The work function metal layers 142 and 144 may each be a p-type or an n-type work function layer depending on whether the device 100 is configured to be a PFET (p-type) or an NFET (n-type). Examples of p-type work function material includes titanium nitride (TiN), tantalum nitride (TaN), ruthenium (Ru), molybdenum (Mo), tungsten (W), platinum (Pt), suitable p-type work function materials, or combinations thereof. Examples of n-type work function material includes titanium (Ti), aluminum (Al), tantalum carbide (TaC), tantalum carbide nitride (TaCN), tantalum silicon nitride (TaSiN), titanium silicon nitride (TiSiN), other suitable n-type work function materials, or combinations thereof. In some embodiments, the HKMG 120 includes additional work function metal layers. In an embodiment, a threshold voltage of the HKMG 120 is tuned by including multiple work function metal layers of the same type or opposite types. The bulk (or fill) conductive layer 146 may include copper (Cu), tungsten (W), cobalt (Co), ruthenium (Ru), aluminum (Al), other suitable conductive materials, or combinations thereof.

The device 100 further includes gate spacer 150 disposed along sidewalls of the gate electrode 132 and over portions of the high-k dielectric layer 124, the interfacial layer 122, and the semiconductor layer 104. The gate spacer 150 may include a single layer or multiple layers of a dielectric material, such as silicon oxycarbonitride, silicon nitride, silicon oxynitride, silicon oxide, silicon carbide, other suitable dielectric materials, or combinations thereof. In an embodiment, referring to FIG. 1B, the gate spacer 150 includes at least three layers (152, 154, and 156) of dielectric materials. Layer 152 may include silicon oxide (SiO$_2$), silicon oxynitride (SiON), silicon oxycarbonitride (SiOCN), or other suitable material(s), and is disposed along sidewalls of the gate electrode 132, portions of the high-k dielectric layer 124, the interfacial layer 122, and the semiconductor layer 104. Layer 154 may include silicon oxynitride, silicon oxycarobnitride, or other suitable material(s), and is disposed over the layer 152. The layer 154 and 152 may have different materials or different compositions of materials. Layer 156 may include silicon nitride and is disposed over the layer 154. In many embodiments, the layers 152 and 154 are configured to promote adhesion between the layer 156 and components of the HKMG 120. In many embodiments, the gate spacer 150 includes dielectric material(s) different from that of the isolation structure 106 and the ILD layer 114. In some embodiments, bottom portions of one or more of the layers 152, 154, and 156 included in gate spacer 150 have a step profile similar to the step profile of the gate electrode 132, the high-k dielectric layer 124, and/or the interfacial layer 122. For example, referring to FIG. 1B, a portion of the layer 152 contacts, the work function metal layer 142, a portion of the top surface of the high-k dielectric layer 124, and a portion of the top surface of the interfacial layer 122. The layer 154 is configured to have a similar step profile as the layer 152.

Referring to FIGS. 1A and 1E, the source/drain features 110 (or epitaxial source/drain features) are disposed in source/drain regions of the semiconductor layer 104, i.e., on opposite sides of the HKMG 120, and the channel region is defined in the semiconductor layer 104 between the source/drain features 110 and between the doped regions 108. The source/drain features 110 include a semiconductor material epitaxially grown in the source/drain regions of the semiconductor layer 104. In many embodiments, the source/drain features 110 are doped with n-type dopants and/or p-type dopants. In some embodiments where the device 100 is configured as an n-type device (e.g., having an n-channel), the source/drain features 110 include epitaxially grown silicon and/or silicon carbon doped with phosphorous and/or other n-type dopants (for example, forming a Si:P epitaxial layer or a Si:C:P epitaxial layer). In some embodiments where the device 100 is configured as a p-type device (for example, having a p-channel), the source/drain features 110 include epitaxially grown SiGe doped with boron and/or other p-type dopants (for example, forming a Si:Ge:B epitaxial layer). In some embodiments, the source/drain features 110 include materials and/or dopants that achieve desired tensile stress and/or compressive stress in the channel region.

Referring to FIG. 1E, the silicide layer 112 is disposed between surface(s) of the source/drain features 110 and the ILD layer 114. For embodiments in which the device 100 is a FinFET device, the silicide layer 112 wraps around the surfaces of the source/drain features 110, which are raised above a plane of the substrate 102. In many embodiments, because the silicide layer 112 wrap around the source/drain features 110, a bottom portion of the silicide layer 112 is below the interfacial layer 122. In many embodiments, the silicide layer 112 includes nickel silicide, cobalt silicide, tungsten silicide, tantalum silicide, titanium silicide, platinum silicide, erbium silicide, palladium silicide, other suitable silicide, or combinations thereof.

The ILD layer 114 may include one or more dielectric materials, such as silicon oxide, silicon nitride, silicon oxynitride, tetraethylorthosilicate (TEOS) oxide, un-doped silicate glass, doped silicon oxide such as borophosphosilicate glass (BPSG), fused silica glass (FSG), phosphosilicate glass (PSG), boron doped silicon glass (BSG), a low-k dielectric material, and/or other suitable dielectric materials. In an embodiment, the ILD layer 114 includes a low-k dielectric material. The ILD layer 114 may include a multilayer structure having multiple dielectric materials. In many embodiments, the isolation structure 106, the gate spacer 150, and the ILD layer 114 include different dielectric material(s).

Referring to FIGS. 1A and 1E, the contact plugs 160 are disposed in the ILD layer 114 and over the source/drain features 110, such that a bottom surface of the contact plugs electrically and/or physically contact the silicide layer 112 disposed over the source/drain features 110. The contact plugs 160 are configured to couple the source/drain features 110 to additional conductive features such as vias and/or metal lines subsequently formed in the device 100. The contact plugs 160 include a conductive material such as copper (Cu), tungsten (W), cobalt (Co), ruthenium (Ru), aluminum (Al), other suitable conductive materials, or combinations thereof. FIG. 1E, a portion of the contact plugs 160 in contact with the silicide layer 112 has a width 162 and the silicide layer 112 at its widest portion has a width 164. In at least one embodiment, the width 164 is greater than the width 162.

FIGS. 2A and 2B illustrate a flow chart of a method 200 for forming the device 100 in accordance with some embodiments of the present disclosure. The method 200 is merely an example, and is not intended to limit the present disclosure beyond what is explicitly recited in the claims. Additional operations can be performed before, during, and after the method 200, and some operations described can be replaced, eliminated, or moved around for additional embodiments of the method. The method 200 is described below in reference to FIGS. 3-16, which illustrate various cross-sectional views of the device 100, such as those illustrated and described in FIGS. 1A-1E, at intermediate steps of the method 200.

Figure 3:
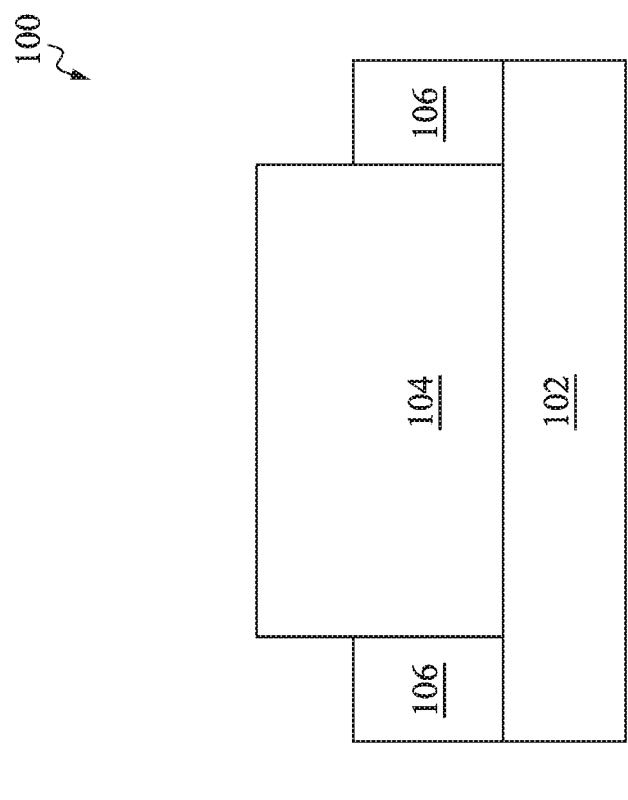

At operation 202, referring to FIGS. 2A and 3, the method 200 at operation 202 provides (or is provided with) the device 100 having the substrate 102, the semiconductor layer 104 formed in or protruding out of the substrate 102, and the isolation structure 106 formed over the substrate 102 as depicted in FIGS. 1A and 1B. The various materials suitable for forming the substrate 102, the semiconductor layer 104, and the isolation structure 106 have been discussed above.

In an embodiment, the semiconductor layer 104 includes a semiconductor fin (e.g., as depicted in FIGS. 1C and 1D) and the method 200 forms the semiconductor layer 104 by epitaxially growing one or more semiconductor layers over the entire area of the substrate 102 and then patterning the semiconductor layers to form the fins. The semiconductor layer 104 may be patterned by any suitable method. For example, the semiconductor layer 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor layer 104 by etching the initial epitaxial semiconductor layers. The etching process can include dry etching, wet etching, reactive ion etching (RIE), and/or other suitable processes. A dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, an oxygen-containing gas (e.g., $O_2$), a nitrogen-containing gas (e.g., $N_2$), helium, argon, and/or other suitable gases and/or plasmas. A wet etching process may be implemented in hydrochloric acid (HCl), potassium hydroxide (KOH), ammonium hydroxide ($NH_4OH$), hydrogen peroxide ($H_2O_2$), sulfuric acid ($H_2SO_4$), nitric acid ($HNO_3$), hydrofluoric acid (HF), phosphoric acid ($H_3PO_4$), ammonium phosphate (($NH_4)_3PO_4$), tetramethylammonium hydroxide (TMAH), and/other suitable etchants. Alternatively or additionally, the wet etching process may utilize a mixture of solutions such as a standard-clean 1 (SC1; also known as an ammonia-peroxide mixture (APM)) mixture including $NH_4OH$, $H_2O_2$, and distilled water (DIW)), a standard-clean 2 (SC2) mixture including HCl, $H_2O_2$, and DIW, or a mixture of $H_2SO_4$, $H_2O_2$, and DIW.

The isolation structure 106 may be formed by one or more deposition and etching methods. The deposition methods may include thermal oxidation, chemical oxidation, and chemical vapor deposition (CVD), such as flowable CVD (FCVD). The etching methods may include dry etching and/or wet etching, followed by a planarizing method such as chemical mechanical polishing/planarizing (CMP).

Figure 4:
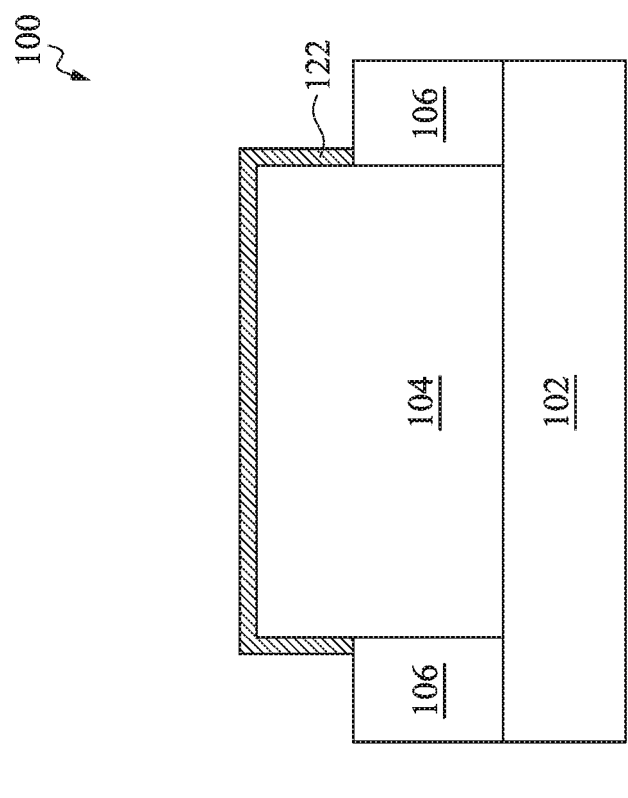

Referring to FIGS. 2A and 4, the method 200 at operation 204 forms the interfacial layer 122 over the semiconductor layer 104. The various materials suitable for forming the interfacial layer 122 have been discussed above in reference to FIGS. 1A and 1B. In an embodiment, the interfacial layer 122 is formed by performing a chemical cleaning process to the portion of the semiconductor layer 104, thereby forming the interfacial layer 122 that includes silicon oxide, silicon oxynitride, other suitable chemical oxides, or combinations thereof. In an example embodiment, the chemical cleaning process implements a mixture that includes sulfuric acid. In many embodiments, the interfacial layer 122 is provided to improve adhesion between the semiconductor layer 104 and a subsequently formed material layer, such as the high-k dielectric layer 124. Alternatively, the interfacial layer 122 may be formed by an oxidation process such as chemical oxidation, thermal oxidation, other suitable oxidations processes, or combinations thereof.

Figure 5:
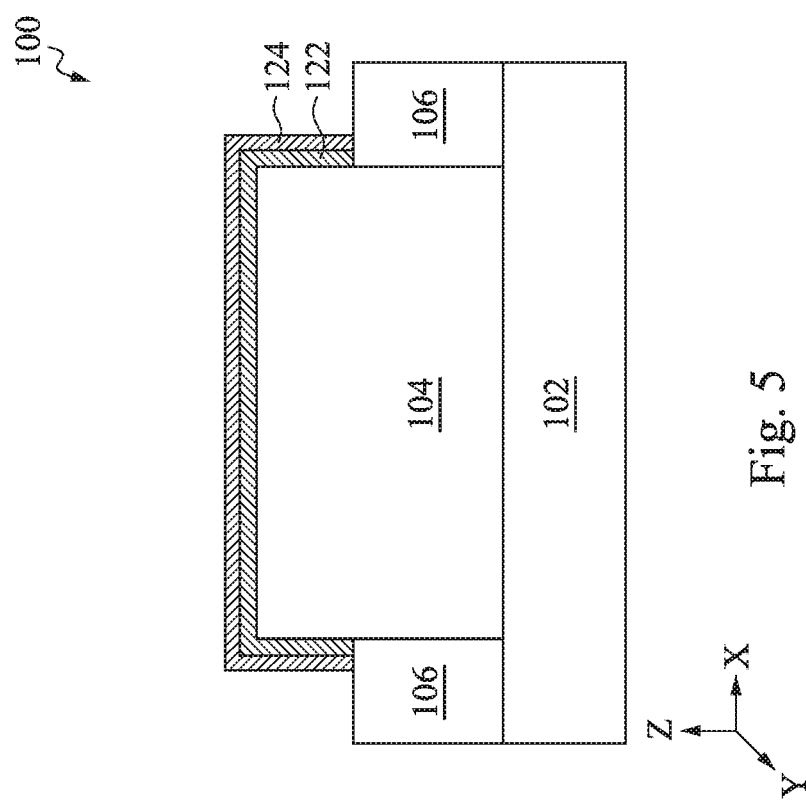

Subsequently, referring to FIG. 5, the method 200 at operation 206 forms the high-k dielectric layer 124 over the interfacial layer 122. The various materials suitable for forming the high-k dielectric layer 124 have been discussed above in reference to FIGS. 1A and 1B, and may be, for example, hafnium oxide ($HfO_2$), hafnium silicon oxide (HfSiO), alumina ($Al_2O_3$), zirconium oxide ($ZrO_2$), lanthanum oxide ($La_2O_3$), other suitable high-k dielectric materials, or combinations thereof. The high-k dielectric layer 124 may be deposited using any suitable deposition process, such as CVD, atomic layer deposition (ALD), physical vapor deposition (PVD), other deposition processes, or combinations thereof. The high-k dielectric layer 124 may be deposited to any suitable thickness, such as about 1 nm to about 2 nm. A thickness outside this range may cause reliability and/or performance degradation of the device. In one example, if the thickness of the high-k dielectric layer 124 is too thin (e.g., less than about 1 nm), reliability of the device may become a concern due to phenomena such as time-dependent dielectric breakdown (or TDDB). In another example, if the thickness of the high-k dielectric layer 124 is too thick (e.g., greater than about 2 nm), the performance of the device may be degraded due to a higher equivalent oxide thickness (or EOT) than desired. In an example embodiment, the depositing of the high-k dielectric layer 124 is implemented at a temperature of about 300 degrees Celsius for about 5 minutes. The present disclosure, of course, is not limited to this set of processing conditions.

In some embodiments, after depositing the high-k dielectric layer 124, the method 200 at operation 206 optionally performs an annealing process (referred to as a "post-deposition annealing," or a PDA process). In an embodiment, the PDA process implements a spike anneal, during which the high-k dielectric layer 124 is annealed in a peak temperature of about 800 degrees Celsius to about 900 degrees Celsius for about 1 second in an inert environment, such as a nitrogen environment. The PDA process may be tuned to allow material in the high-k dielectric layer 124 to crystallize before performing subsequent fabrication steps. In some embodiments, the PDA process is optional and the high-k dielectric layer 124 is not subjected to the PDA process after being formed.

Figure 6:
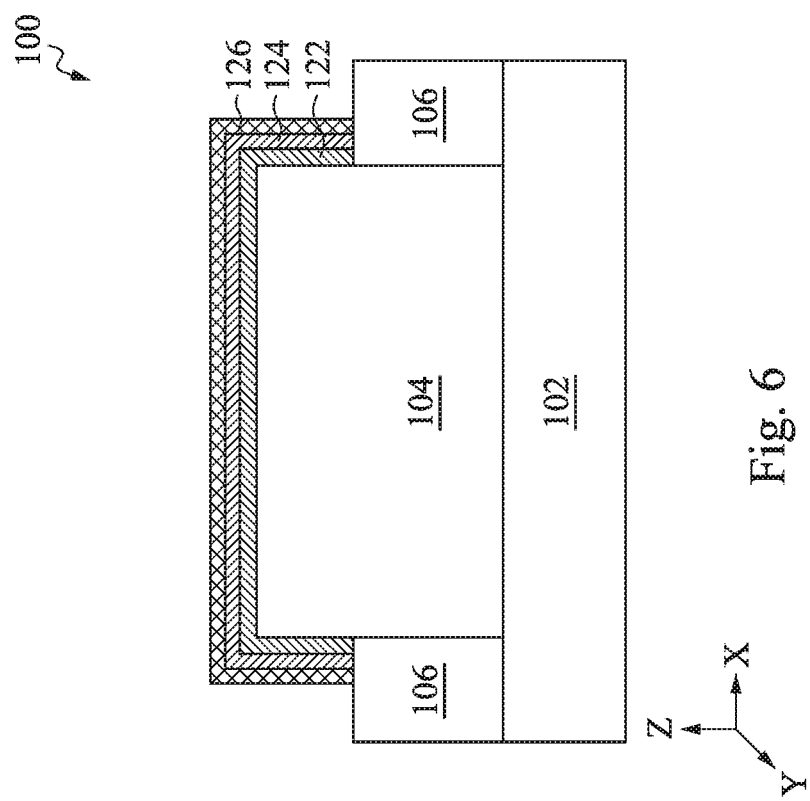

In an embodiment, referring to FIGS. 2A and 6, after depositing the high-k dielectric layer 124 (including, for example, performing the PDA process subsequently), the method 200 at operation 206 forms a capping layer 126 over the high-k dielectric layer 124. In many embodiments, the capping layer 126 is provided to limit excessive regrowth of the interfacial layer 122 that would result in a thicker EOT. The capping layer 126 may include one or more conductive material, such as titanium nitride (TiN), titanium silicon nitride (TiSiN), tantalum silicon nitride (TaSiN), tantalum nitride (TaN), tantalum carbide (TaC), tantalum carbide nitride (TaCN), other suitable metal materials, or combinations thereof. In an embodiment, the capping layer 126 includes titanium nitride. The capping layer 126 may be formed by any suitable deposition process, such as CVD, ALD, PVD, other suitable processes, or combinations thereof to at a temperature of about 375 degrees Celsius. In some example, the thickness of the capping layer 126 may range from 1 to 2 nm. If the thickness of the capping layer 126 is too thin (e.g., less than about 1 nm), the capping layer 126 may not effectively block the regrowth of the interfacial layer 122, and if the thickness of the capping layer 126 is too thick (e.g., greater than about 2 nm), the number of metal gate conductive layers that could be formed in the subsequent gate replacement process may be limited due to reduced space in the gate trench. In an embodiment, after depositing the capping layer 126, the method 200 optionally performs an annealing process (referred to as a "post-metallization annealing," or a PMA process). In an embodiment, the PMA process implements a spike anneal, during which the capping layer 126 is annealed in a peak temperature of about 800 degrees Celsius to about 900 degrees Celsius for about 1 second in an inert environment, such as a nitrogen environment. Though similar to the PDA process applied to the high-k dielectric layer 124, the PMA process may be implemented with different annealing conditions depending upon different design requirements. The PMA process may be tuned to limit the regrowth of the interfacial layer 122 for improved device reliability. In many embodiments, the forming and the annealing of the capping layer 126 may be omitted.

Furthermore, in an embodiment, the method 200 at operation 206 forms a second capping layer (not depicted) over the capping layer 126. The second capping layer differs from the capping layer 126 in that the second capping layer is a silicon-containing capping layer that may be formed by a deposition process (such as CVD, ALD, PVD, other suitable processes, or combinations thereof) to a thickness of about 2 nm to about 6 nm at a temperature of about 390 degrees Celsius. The method 200 subsequently performs an annealing process (referred to as a "post capping layer anneal" or a PCA process). The PCA process may be implemented as a spike anneal at a peak temperature of about 850 degrees Celsius to about 910 degrees Celsius for about 1 second. Following the PCA process, the second capping layer is removed from the device 100 by any suitable methods, such as a dry etching or a wet etching method (for example, using a wet etchant such as HF). In many embodiments, the second capping layer is provided to prevent the capping layer 126 from absorbing oxygen and forming excessive oxide that would degrade performance the device 100. In some embodiments, the forming, annealing, and removing of the second capping layer are omitted from the implementation of the method 200.

Figure 7:
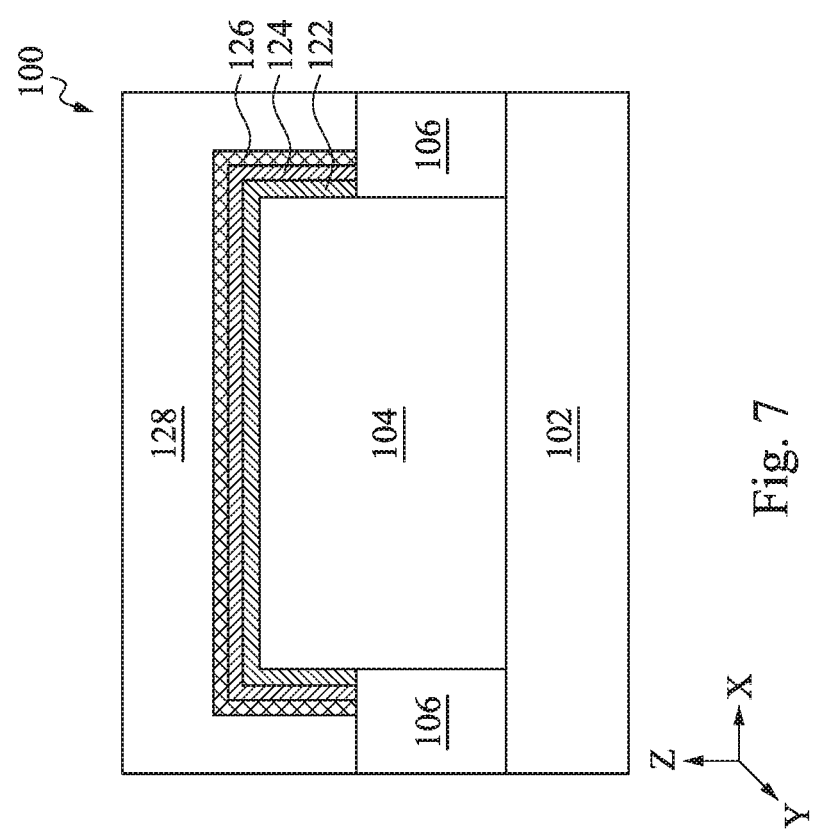

Referring to FIGS. 2A and 7, the method 200 at operation 208 deposits a polysilicon layer 128 over the capping layer 126 (or directly over the high-k dielectric layer 124 if the capping layer 126 is omitted). The polysilicon layer 128 may be formed by any deposition processes such as CVD, LPCVD, PECVD, other suitable deposition processes, or combinations thereof.

Figure 8B:
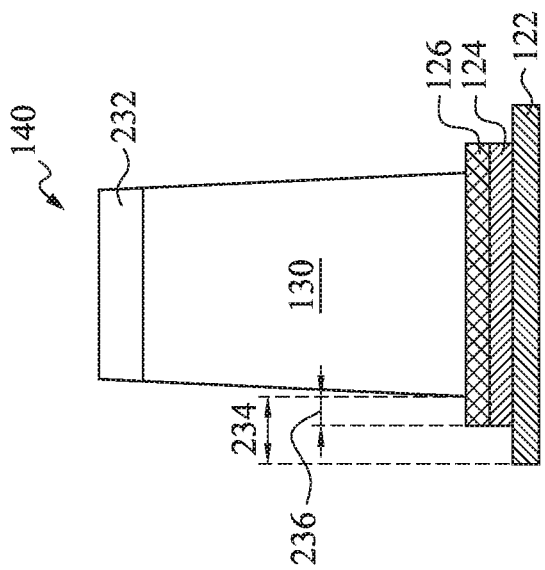
Figure 8A:
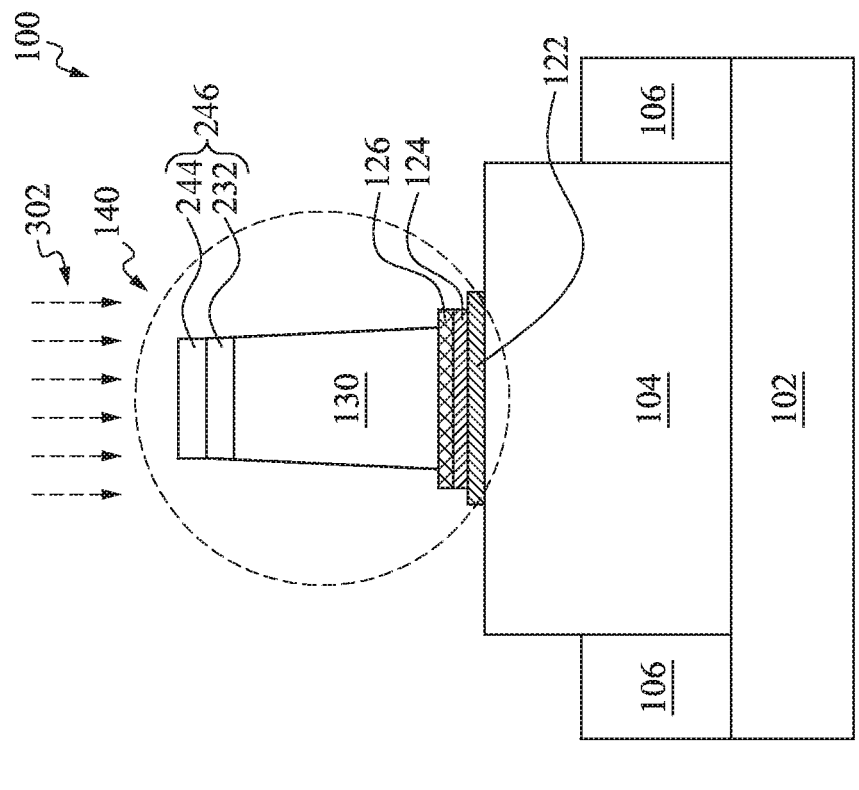

Referring to FIGS. 2A and 8A-8B, the method 200 at operation 210 patterns the polysilicon layer 128 (and one or more hard mask layers such as a hard mask layer 232) to form a dummy gate electrode 130. Particularly, the process recipes and conditions of the method 200 are tuned such that a length of the dummy gate electrode 130 is formed to be less than a length of the high-k dielectric layer 124 along direction X. As depicted in FIG. 8A, the method 200 forms a masking element 246 over the polysilicon layer 128 to expose portions thereof to be removed. The masking element 246 may include a patterned resist layer 244 and may additionally include other material layers, such as the hard mask layer 232. The method 200 thereafter implements an etching process 302 to remove portions of the hard mask layer 232, polysilicon layer 128, the capping layer 126, the high-k dielectric layer 124, and the interfacial layer 122, resulting in a dummy gate electrode 130 having slanted sidewalls (i.e., a bottom portion of the dummy gate electrode 130 being wider than a top portion of the dummy gate electrode 130). After the etching process 302 is completed, the patterned resist layer 244 is removed from the dummy gate electrode 130 by any suitable method, such as plasma ashing or resist stripping. The hard mask layer 232 remains above the dummy gate electrode 130 at this fabrication step.

In the present embodiment, the dummy gate electrode 130 will be replaced by a gate electrode (for example, see FIGS. 15 and 16 below and the associated texts). However, the high-k dielectric layer 124 will remain in the final device and function as the gate dielectric or part thereof. Since the high-k dielectric layer 124 is deposited before the dummy gate electrode 130 is deposited, the current process is also referred to as a "high-k first" process. This is different from other processes during which the high-k dielectric layer 124 is not formed until the dummy gate electrode 130 is replaced (those are referred to as "high-k last" processes). The "high-k first" process allows the high-temperature annealing of the high-k dielectric layer 124 to be performed in earlier in the fabrication, and subsequently, the silicidation process of the source/drain features 110 to be performed before the gate replacement process. As such, a silicide layer (e.g., the silicide layer 112) may fully wrap around the source/drain features 110 as described in detail below. Further, because the high-k dielectric layer 124 is formed before replacing the dummy gate electrode 130, more space can be allocated to forming additional work function metal layers (e.g., the work function metal layers 142 and 144) for purposes of tuning threshold voltage of the HKMG. Similarly, the "high-k first" process also allows more space to form the bulk conductive layer (e.g., the bulk conductive layer 146), reducing the contact resistance between the HKMG and a subsequently formed contact plug (not depicted) over the HKMG.

In many embodiments, the etching process 302 includes a two-step etching process. The first step of the etching process 302 may be implemented using a dry etchant that includes a chlorine-containing gas (e.g., $Cl_2$), fluorine-containing gas (e.g., $CF_4$, $CHF_3$, $CH_3F$, or $NF_3$), a bromine-containing gas (e.g., HBr), an oxygen-containing gas (e.g., $O_2$), other suitable gases, or combinations thereof. The first step may be implemented with an etching power of about 300 W to about 1000 W for about 10 seconds to about 100 seconds. The second step of the etching process 302 may be implemented using a dry etchant that includes a chlorine-containing gas (e.g., $Cl_2$), a bromine-containing gas (e.g., HBr), an oxygen-containing gas (e.g., $O_2$), other suitable gases, or combinations thereof.

In one example, as illustrated in FIG. 8B, which is an enlarged view of a portion 140 of the device 100 illustrated in FIG. 8A, the etching process 302 may be tuned to selectively remove portions of the high-k dielectric layer 124 and the capping layer 126 with respect to the interfacial layer 122. As such, in at least one embodiment, an outer edge of the interfacial layer 122 extends from an outer edge of the dummy gate electrode 130 by a distance 234, and an outer edge of the capping layer 126 and/or the high-k dielectric layer 124 extends from the outer edge of the dummy gate electrode 130 by a distance 236, where the distance 234 is greater than the distance 236. In another example, the outer edges of the interfacial layer 122 are aligned with the outer edges of the high-k dielectric layer 124, i.e., the distance 234 is similar to the distance 236.

Specifically, during one or both steps of the etching process 302, polymeric gaseous species may be deposited over the device 100 to control the etching of the polysilicon layer 128 with respect to the interfacial layer 122, the high-k dielectric layer 124, and/or the capping layer 126, resulting in the footing profile depicted and described in FIGS. 1A and 1B. In one example, to form the footing profile, the polysilicon layer 128 may be etched more laterally (i.e., along direction X) with respect to the interfacial layer 122 and/or the high-k dielectric layer 124 during the second etching step by depositing less polymeric gaseous species along sidewalls of the polysilicon layer 128 than during the first etching step (i.e., anisotropic etching of the polysilicon layer 128). Alternatively or additionally, more polymeric gaseous species may be deposited during the second etching step to limit the extent of the lateral etching of the interfacial layer 122 and/or the high-k dielectric layer 124 relative to the polysilicon layer 128, such that a remaining portion of the interfacial layer 122 and/or the high-k dielectric layer 124 may extend laterally beyond the outer edges of the dummy gate electrode 130 along direction X (e.g., FIGS. 8A and 8B). In some embodiments, because a bottom portion of the polysilicon layer 128 near the interfacial layer 122 and the high-k dielectric layer 124) is etched to a lesser extent than the top portion, the dummy gate electrode 130 may be configured to have slanted sidewalls as depicted and described in FIGS. 1A and 1B. Examples of the polymeric gaseous species include oxygen-containing species, carbon dioxide-containing species, nitrogen-containing species, species that produce polymeric etching by-product(s), or combinations thereof. Furthermore, alternative or in additional to depositing polymeric gaseous species, different etchants or combinations of etchants may be used to achieve selective etching of the polysilicon layer 128, the high-k dielectric layer 124, the interfacial layer 122, and/or the capping layer 126 in order to form the footing profile discussed herein.

Figure 9:
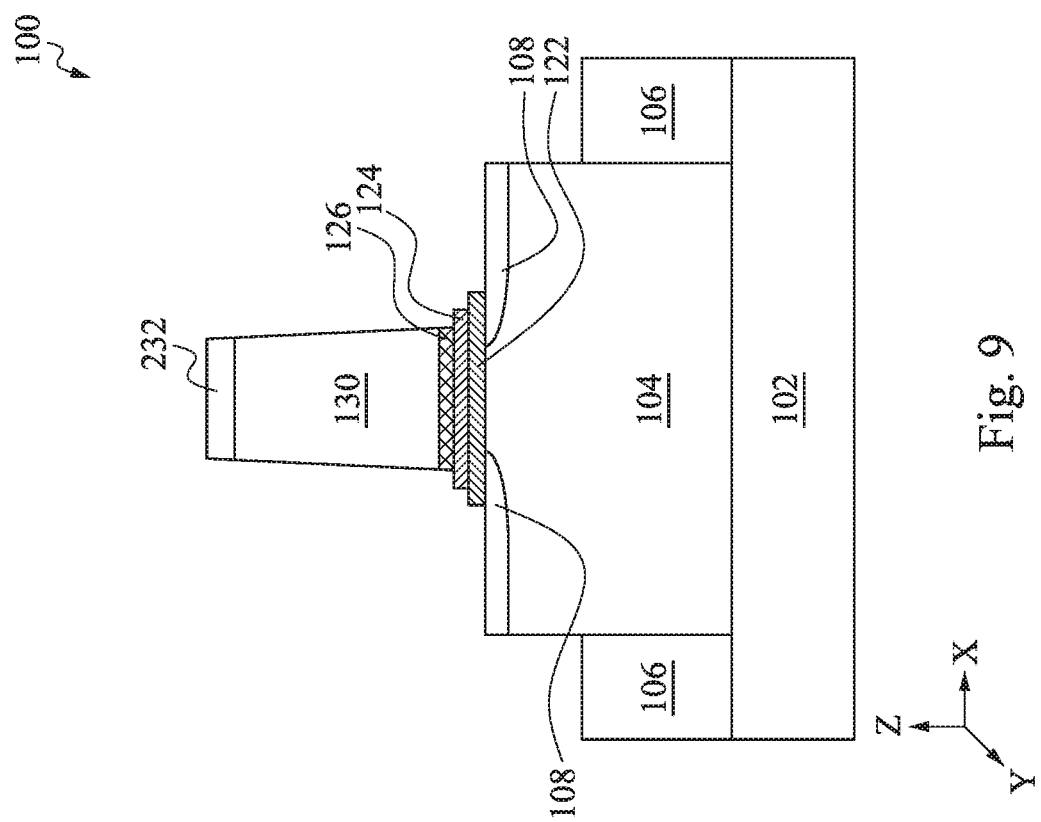

Referring to FIGS. 2A and 9, the method 200 at operation 212 forms doped regions (e.g., LDD regions or source/drain extension regions) 108 on both sides of the dummy gate electrode 130 and between the source/drain regions of the semiconductor layer 104. For example, the doped regions 108 may be formed by implanting ions into the semiconductor layer 104 using tilted and rotated ion implantation and using the dummy gate electrode 130 as a mask, followed by an annealing process to activate the dopants. The doped regions 108 may include one layer or multiple layers of different depths below a top surface of the semiconductor layer 104. The doped regions 108 may be n-type doped regions or p-type doped regions depending upon the types of field-effect transistor (FET) device desired. For example, the doped regions 108 include n-type dopants for forming NFET devices. Alternatively, the doped regions 108 include p-type dopants for forming PFET devices. The doped regions 108 may be formed to extend laterally to underneath the dummy gate electrode 130 (as depicted in FIG. 7), or not extending underneath the dummy gate electrode 130 in an alternative embodiment. In various embodiments, the doped regions 108 include extensions of the source/drain regions of the device 100. In some embodiments, the doped regions 108 may be formed after forming the gate spacer 150 and before forming source/drain features 110 in the device 100.

Referring to FIGS. 2B, 10A, and 10B, the method 200 at operation 214 forms gate spacer 150 along sidewalls of the dummy gate electrode 130, the high-k dielectric layer 124, the interfacial layer 122, and/or the capping layer 126, and on exposed portions of a top surface of the high-k dielectric layer 124, the interfacial layer 122, and/or the capping layer 126. As depicted and described in FIGS. 1A and 1B, the gate spacer 150 may be a multi-layer structure including the layers 152, 154, and 156 as discussed above. Each of the layers 152, 154, and 156 may be formed by depositing a spacer material as a blanket over the isolation structure 106, the semiconductor layer 104, and the dummy gate electrode 130. Then the spacer material is etched by an anisotropic etching process to expose the isolation structure 106, a top surface of the dummy gate electrode 130, and a top surface of the semiconductor layer 104. Portions of the spacer material along sidewalls of the dummy gate electrode 130, the high-k dielectric layer 124, the interfacial layer 122, and/or the capping layer 126, and on exposed portions of the top surface of the high-k dielectric layer 124, the interfacial layer 122, and/or the capping layer 126 become the layers 152, 154, and 156 of the gate spacer 150.

Figure 11:
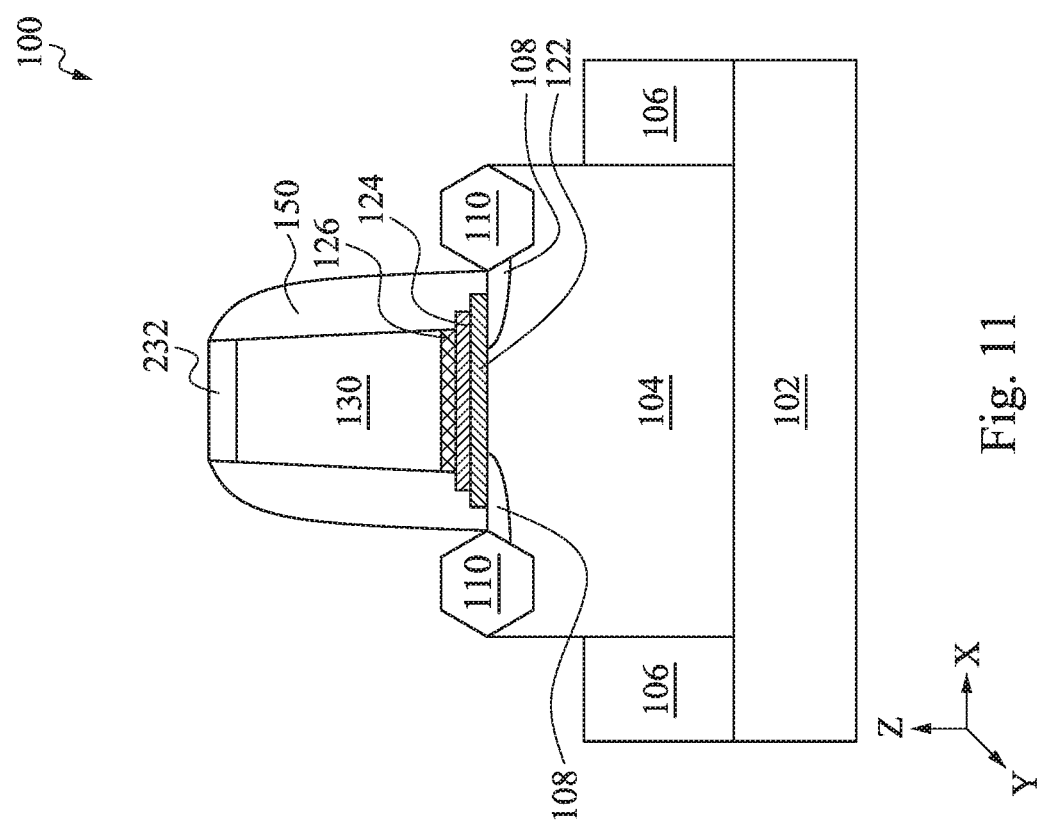

Referring to FIGS. 2B and 11, the method 200 at operation 216 forms the source/drain features 110 in the device 100. The various materials suitable for forming the source/drain features 110 have been discussed above with reference to FIGS. 1A and 1B. In an embodiment, the method 200 forms recesses (not depicted) in portions of the semiconductor layer 104 by an etching process, and epitaxially grows semiconductor materials in the recesses as the source/drain features 110. A cleaning process may be optionally performed to clean the recesses with a hydrofluoric acid (HF) solution or other suitable solution(s) prior to epitaxially growing the semiconductor materials. The semiconductor materials may be raised above a top surface of the semiconductor layer 104, as illustrated in FIG. 11; alternatively, the semiconductor materials are formed in and coplanar with the top surface of the semiconductor layer 104. The method 200 may form the source/drain features 110 separately for NFET and PFET devices. For example, the method 200 may form the source/drain features 110 with n-type doped silicon for NFET devices or p-type doped silicon germanium for PFET devices. The method 200 may implement CVD deposition techniques (e.g., vapor-phase epitaxy (VPE), ultra-high vacuum CVD (UHV-CVD), LPCVD, PECVD, other suitable CVD techniques, or combinations thereof), molecular beam epitaxy, selective epitaxial growth (SEG), other suitable processes, or combinations thereof to form the source/drain features 110. In many embodiments, the source/drain features 110 and the doped regions 108 include dopants of similar semiconductor types but different concentrations. For example, the source/drain features 110 and the doped regions 108 may both include an n-type dopant such as phosphorous, but the source/drain features 110 may include much higher dopant concentration than the doped regions 108. In many embodiments, the source/drain features 110 overlap with portions of the doped regions 108.

Figure 12:
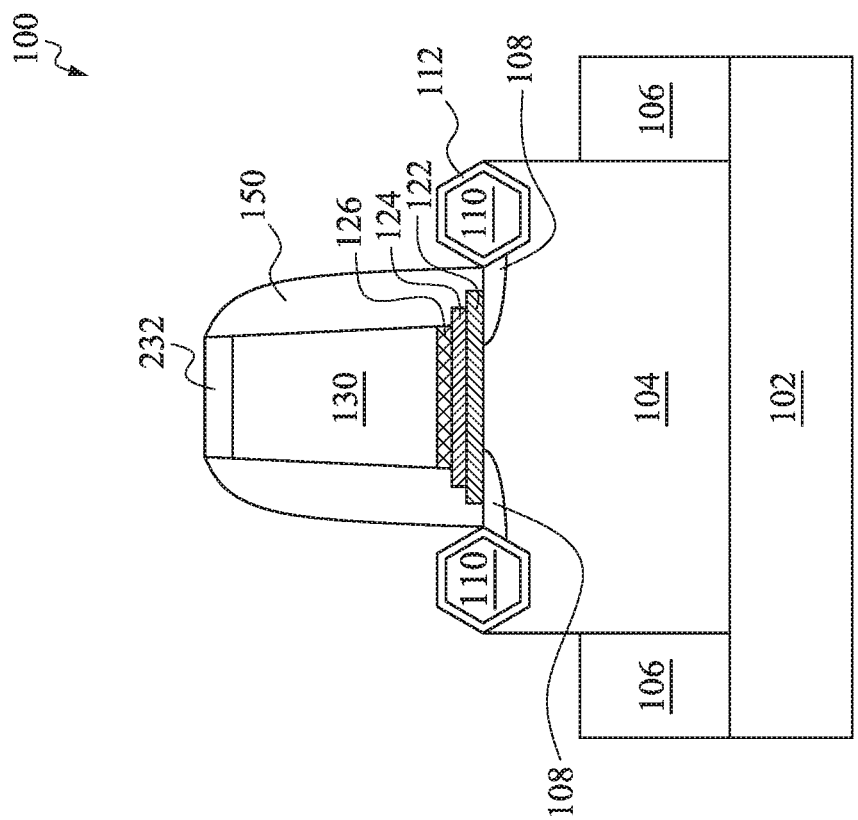

Referring to FIGS. 2B and 12, the method 200 at operation 218 forms a silicide layer 112 on surfaces of the source/drain features 110. Various materials suitable for forming the silicide layer 112 have been discussed above with reference to FIGS. 1A and 1C. The silicide layer 112 may be formed by a deposition process such as CVD, ALD, PVD, other suitable processes, or combinations thereof. For example, a metal layer (e.g., nickel) may be deposited over the source/drain features 110. Then, the device 100 is annealed to allow the metal layer and the semiconductor materials of the source/drain features 110 to react. Thereafter, the un-reacted metal layer is removed, leaving the silicide layer 112 over the source/drain features 110. Particularly, the silicide layer 112 wraps around an upper portion of the source/drain features 110 in the present embodiment and conforms to the shape (e.g., a hexagonal shape, or a diamond shape, etc.) of the upper portion of the source/drain features 110.

Generally, a silicide layer (e.g., the silicide layer 112) can withstand a processing temperature of up to about 500 degrees Celsius. As a result, forming and thermally treating a high-k dielectric layer (e.g., the high-k dielectric layer 124) in "high-k last" processes presents risks of damaging the silicide layer and increasing contact resistance of the device as a result. Therefore, in the "high-k last" processes, formation of the silicide layer is generally postponed after the dummy gate has been replaced with a HKMG and after a contact hole is etched in an ILD layer over the source/drain features and before depositing a contact plug. This process limits a contact area between the silicide layer and the source/drain features to only the area exposed by the contact hole, thereby limiting the reduction of contact resistance provided by the silicide layer. In the present disclosure, however, because the high-k dielectric layer 124 has been formed and thermally treated at an earlier fabrication step (e.g., at operation 206), the silicide layer 112 can be formed on each exposed surface of the source/drain features 110 prior to forming the ILD layer 114, increasing the contact area (i.e., reducing the contact resistance) between the silicide layer 112 and the source/drain features 110. In an example embodiment, referring back to FIG. 1E, the silicide layer 112 is formed to wrap around the upper portion of the source/drain features 110.

Figure 13:
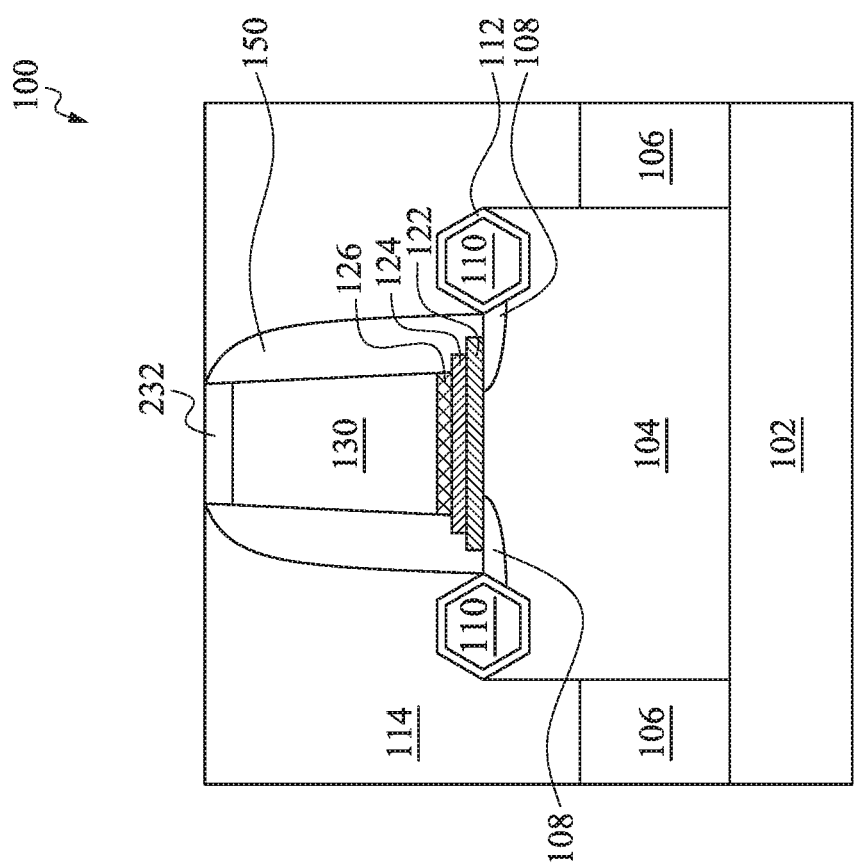

Thereafter, referring to FIG. 13, the method 200 forms the ILD layer 114 over the source/drain features 110 (including the silicide layer 112), the dummy gate electrode 130, the gate spacer 150, and the isolation structure 106. In some embodiments, the method 200 forms a contact etch-stop layer (CESL; not depicted) before forming the ILD layer 114. The CESL may include silicon nitride, silicon oxynitride, silicon oxycarbonitride, other suitable materials, or combinations thereof, and may be formed by CVD, PVD, ALD, other suitable methods or combinations thereof. The various materials suitable for forming the ILD layer 114 have been discussed above in reference to FIGS. 1A and 1B. The ILD layer 114 may be formed by PECVD, FCVD, other suitable methods, or combinations thereof. The method 200 then performs one or more CMP processes to planarize a top surface of the device 100 and to expose the top surface of the dummy gate electrode 130 as depicted in FIG. 10.

Figure 15:
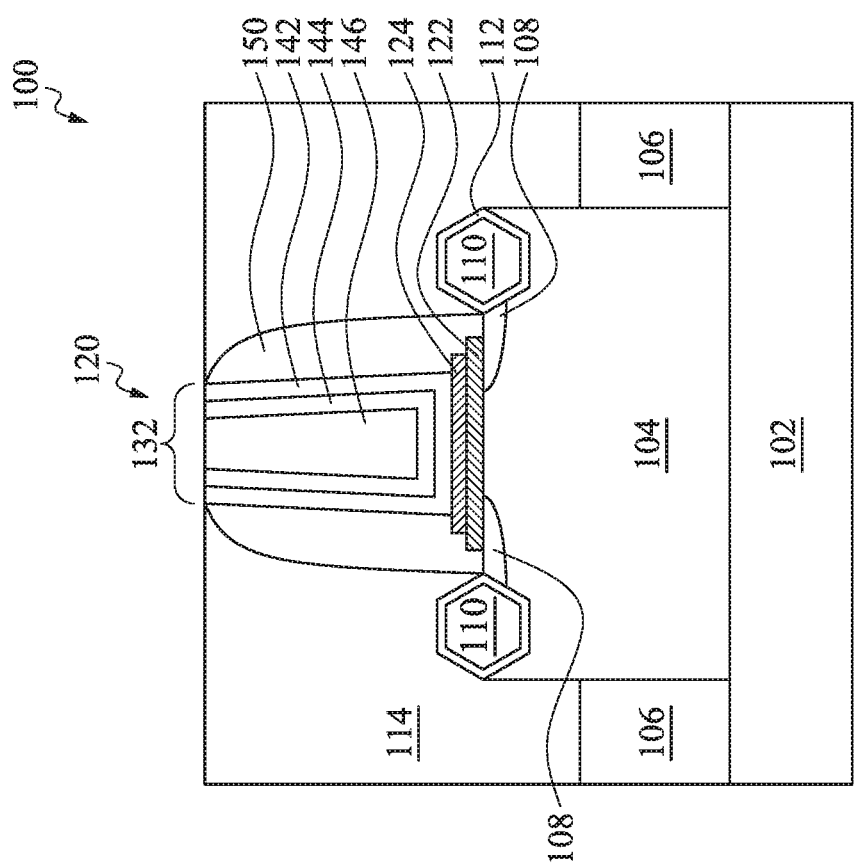
Figure 14:
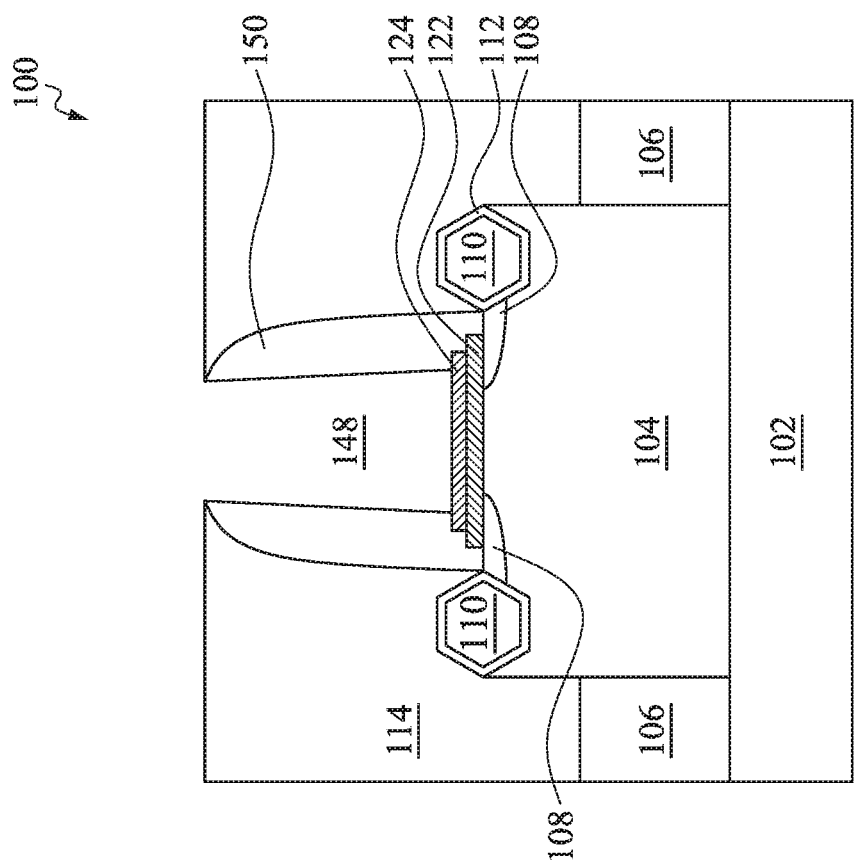

Referring to FIGS. 2B, 14, and 15, the method 200 at operation 220 replaces the dummy gate electrode 130 with the gate electrode 132 as depicted and described in FIGS. 1A and 1B. Referring to FIG. 14, the method 200 first removes the dummy gate electrode 130 to form a gate trench 148 and exposes portions of the underlying material layers. Removing the dummy gate electrode 130 includes performing one or more etching processes that are selective to the material(s) included in the dummy gate electrode 130 (e.g., polysilicon) rather than the gate spacer 150, the capping layer 126, and/or the high-k dielectric layer 124. The etching process(es) may include dry etching, wet etching, RIE, and/or other suitable etching methods. In an embodiment, the etching process(es) for removing the dummy gate electrode 130 implement a dry etchant including a fluorine-containing gas (e.g., $NF_3$), a hydrogen-containing gas (e.g., $H_2$), helium, other suitable gases, or combinations thereof. Such etchant has a very high etch selectivity to the dummy gate electrode 130 and does not etch the high-k dielectric layer 124. In many embodiments as depicted in FIG. 14, the capping layer 126 and the hard mask layer 232 are removed after removing the dummy gate electrode 130, thereby exposing the high-k dielectric layer 124 in the gate trench 148.

Thereafter, referring to FIG. 15, the method 200 forms the gate electrode 132 over the high-k dielectric layer 124 in the gate trench 148, resulting in the HKMG 120. As depicted and described in FIGS. 1A and 1B, the gate electrode 132 includes multiple conductive layers such as the work function metal layers 142 and 144 and the bulk conductive layer 146. Various materials suitable for forming the work function metal layers 142 and 144 and the bulk conductive layer 146 are discussed above. The work function metal layers 142 and 144 may be of the same conductivity type (i.e., both n-type or both p-type) or they may be of opposite conductivity types (i.e., one being n-type and the other being p-type). A number and type of work function metal layer(s) to be included depends upon a desired threshold voltage of the final HKMG 120. Though not depicted, the gate electrode 132 may further include other material layers, such as additional work function metal layers, capping layers, barrier layers, diffusion layers, other suitable layers, or combinations thereof. Various materials layers included in the gate electrode 132 may be deposited by any suitable process such as CVD, PVD, ALD, electroplating (or plating), electroless plating, other suitable deposition processes, or combinations thereof. Thereafter, the method 200 performs one or more CMP processes to planarize a top portion of the device 100, thereby exposing a top surface of the gate electrode 132, the gate spacer 150, and/or a top surface of the ILD layer 114.

In many embodiments, because the high-k dielectric layer 124 is formed before forming and removing the dummy gate electrode 130, no high-k dielectric material is formed in the gate trench 148. As a result, the processing window for forming multiple conductive layers is enlarged, such that more conductive layers can be accommodated in the gate trench 148 in comparison to instances in which the high-k dielectric layer 124 is formed in the gate trench 148 as a part of the gate replacement process. Enabling additional work function metal layers to be included offers opportunities to fine-tune a threshold voltage of the HKMG 120, thereby improving the performance of the device 100. Furthermore, enlarging the processing window allows the bulk conductive layer to be formed to a greater thickness, thereby reducing the contact resistance between the bulk conductive layer and a subsequently formed contact plug (not depicted) over the HKMG 120.

Figure 16:
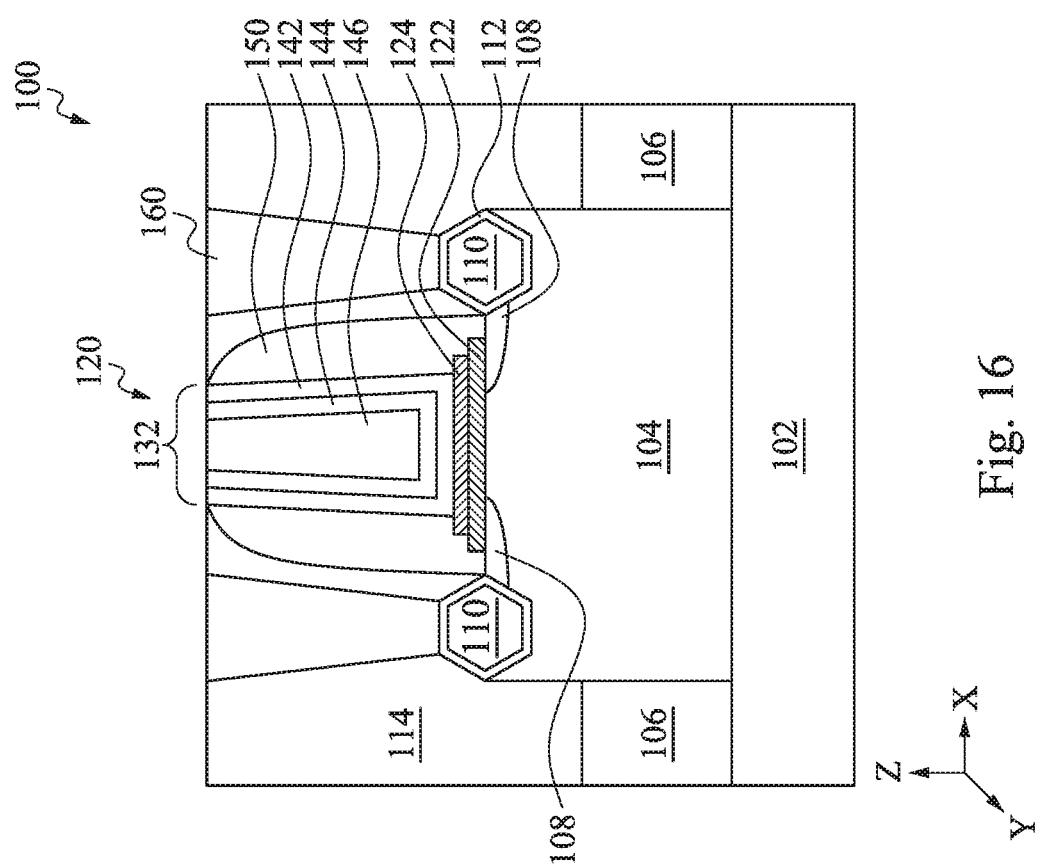

Referring to FIG. 16, the method 200 at operation 222 forms the source/drain contact plugs (or contact plugs) 160 in the ILD layer 114 such that the contact plugs 160 contact the silicide layer 112 formed on the source/drain features 110. Various materials suitable for forming the contact plugs 160 have been depicted and described with reference to FIGS. 1A and 1C. The contact plugs 160 may include copper (Cu), cobalt (Co), ruthenium (Ru), tungsten (W), aluminum (Al), other suitable conductive materials, or combinations thereof. The contact plugs 160 may be formed by patterning and etching the ILD layer 114 to form a contact hole in the ILD layer 114 above the source/drain features 110, and thereafter depositing one or more conductive material in the contact hole by a method such as CVD, ALD, PVD, electroplating, electroless plating, other suitable methods, or combinations thereof. One or more CMP processes are subsequently implemented to remove excess materials from the top surface of the device 100 such that top surfaces of the HKMG 120, the contact plugs 160, and the ILD layer 114 are coplanar.

Subsequently, referring back to FIG. 2B, the method 200 at operation 224 performs additional processing steps to the device 100. For example, the method 200 may form additional vertical interconnect features such as vias connecting the contact plugs 160 (also referred to as device-level contacts) to multilayer interconnect features such as metal layers including conductive lines and interlayer dielectrics formed over the device 100.

Although the embodiments described above show a Fin-FET, the inventive concept of the present disclosure can be applied to other types of transistors including planar FET. For example, in a planar FET, the semiconductor layer 104 is part of the substrate 102 and the substrate 102 may be a bulk silicon substrate or an SOI (silicon-on-insulator) substrate. The disclosed manufacturing methods can be similarly applied to such planar FETs to form a high-k dielectric layer prior to the formation of the dummy gate electrode and to keep such high-k dielectric layer in the final transistor, as described above with respect to the FinFET.

Although not intended to be limiting, one or more embodiments of the present disclosure provide many benefits to a semiconductor device and the formation thereof. For example, in contrast to a "high-k last" process, forming the high-k dielectric layer before forming and removing a dummy gate electrode enlarges a processing window available during the gate replacement process for forming multiple conductive layers (e.g., work function metal layers 142 and 144), affording opportunities to adjust a threshold voltage of the final HKMG for enhanced device performance. Additionally, because a silicide layer may be formed after forming and annealing the high-k dielectric layer, thermal damage to the silicide layer arising from treating the high-k dielectric layer may be reduced (or minimized), and the silicide layer can be formed to a larger surface area than that formed by a subsequent patterning process, resulting in reducing contact resistance between contact plugs and source/drain features.

In one aspect, the present disclosure provides a method that includes forming an interfacial layer over a semiconductor layer, depositing a high-k dielectric layer over the interfacial layer, forming a dummy gate electrode over the high-k dielectric layer, and subsequently patterning the dummy gate electrode, the high-k dielectric layer, and the interfacial layer, resulting in the interfacial layer to extend laterally beyond outer edges of the high-k dielectric layer and the high-k dielectric layer to extend laterally beyond outer edges of the dummy gate electrode. The method further includes forming spacers along sidewalls of the patterned dummy gate electrode, the high-k dielectric layer, and the interfacial layer, forming source/drain features adjacent to the spacers, and replacing the dummy gate electrode with a metal gate electrode to form a high-k metal gate structure.

In another aspect, the present disclosure provides a method that includes forming an interfacial layer over a fin, the fin being oriented in a first direction, depositing a high-k dielectric layer over the interfacial layer, depositing a polysilicon layer over the high-k dielectric layer, where the polysilicon layer is oriented in a second direction generally perpendicular to the first direction, and subsequently patterning the polysilicon layer, the high-k dielectric layer, and the interfacial layer, such that portions of the interfacial layer extend beyond outer edges of the high-k dielectric layer along the first direction. The method further includes forming gate spacers on sidewalls of the polysilicon layer, where portions of the gate spacers are formed over the extended portions of the interfacial layer, forming source/drain features in the fin, forming a silicide layer over the source/drain features, where the silicide layer wraps around the source/drain features, removing the polysilicon layer to form a trench, and subsequently forming a metal gate in the trench.

In yet another aspect, the present disclosure provides a semiconductor structure that includes a high-k metal gate structure (HKMG) disposed over a channel region of a semiconductor layer formed over a substrate, where the HKMG includes an interfacial layer disposed over the semiconductor layer, a high-k dielectric layer disposed over the interfacial layer, and a gate electrode disposed over the high-k dielectric layer, where a length of the high-k dielectric layer is greater than a length of the gate electrode and where outer edges of the interfacial layer, the high-k dielectric layer, and the gate electrode form a step profile. The semiconductor structure further includes gate spacers having sidewall portions contacting sidewalls of the gate electrode and bottom portions contacting top portions of the high-k dielectric layer and the interfacial layer, and source/drain features disposed in the semiconductor layer adjacent to the HKMG.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an interfacial layer over a semiconductor layer;
    depositing a high-k dielectric layer over the interfacial layer;
    forming a dummy gate electrode over the high-k dielectric layer;
    patterning the dummy gate electrode, the high-k dielectric layer, and the interfacial layer, resulting in the interfacial layer to extend laterally beyond outer edges of the high-k dielectric layer and the high-k dielectric layer to extend laterally beyond outer edges of the dummy gate electrode;
    forming spacers along sidewalls of the patterned dummy gate electrode, the high-k dielectric layer, and the interfacial layer;
    forming source/drain features adjacent to the spacers; and
    replacing the dummy gate electrode with a metal gate electrode.

2. The method of claim 1, further comprising, after depositing the high-k dielectric layer and before forming the dummy gate electrode, performing a spike anneal process.

3. The method of claim 1, further comprising, before replacing the dummy gate electrode, forming a silicide layer on the source/drain features, such that the silicide layer wraps around portions of the source/drain features.

4. The method of claim 1, wherein replacing the dummy gate electrode includes:
    removing the dummy gate electrode to form a trench;
    forming a work function metal layer in the trench, such that sidewall portions of the work function metal layer contact the spacers and a bottom portion of the work function metal layer contacts the high-k dielectric layer; and
    forming a bulk conductive layer over the work function metal layer.

5. The method of claim 1, further comprising forming doped regions below the dummy gate electrode in the semiconductor layer before forming the spacers.

6. The method of claim 1, further comprising forming a capping layer on the high-k dielectric layer before forming the dummy gate electrode, wherein replacing the dummy gate electrode removes the capping layer.

7. The method of claim 6, further comprising performing a spike anneal process to the capping layer in a nitrogen environment before forming the dummy gate electrode.

8. A method, comprising:
    forming an interfacial layer over a fin, the fin being oriented in a first direction;
    depositing a high-k dielectric layer over the interfacial layer;
    depositing a polysilicon layer over the high-k dielectric layer, the polysilicon layer being oriented in a second direction generally perpendicular to the first direction;
    patterning the polysilicon layer, the high-k dielectric layer, and the interfacial layer, such that portions of the interfacial layer extend beyond outer edges of the high-k dielectric layer along the first direction;
    forming gate spacers on sidewalls of the polysilicon layer, wherein portions of the gate spacers are formed over the extended portions of the interfacial layer;
    forming source/drain features in the fin;
    forming a silicide layer over the source/drain features, wherein the silicide layer wraps around portions of the source/drain features;
    removing the polysilicon layer to form a trench; and
    forming a metal gate over the high-k dielectric layer in the trench.

9. The method of claim 8, wherein the patterning of the polysilicon layer, the high-k dielectric layer, and the interfacial layer includes:
    forming an etch mask over a portion of the polysilicon layer; and
    performing an etching process to remove portions of the polysilicon layer exposed by the etch mask, resulting in a patterned polysilicon layer having slanted sidewalls.

10. The method of claim 9, wherein the etching process selectively removes portions of the interfacial layer, the high-k dielectric layer, or both.

11. The method of claim 8, further comprising, after depositing the high-k dielectric layer and before forming the polysilicon layer:
    annealing the high-k dielectric layer;
    depositing a titanium-containing capping layer over the annealed high-k dielectric layer; and
    annealing the titanium-containing capping layer.

12. The method of claim 11, wherein removing the polysilicon layer removes the titanium-containing capping layer to expose the high-k dielectric layer.

13. The method of claim 8, further comprising forming an interlayer dielectric (ILD) layer over the silicide layer before removing the polysilicon layer.

14. A semiconductor structure, comprising:
    a high-k metal gate structure (HKMG) disposed over a channel region of a semiconductor layer formed over a substrate, the HKMG including:
        an interfacial layer disposed over the semiconductor layer, the interfacial layer having a first length along a first direction;
        a high-k dielectric layer disposed over the interfacial layer, the high-k dielectric layer having a second length along the first direction, wherein the second length is less than the first length; and
        a gate electrode disposed over the high-k dielectric layer, the gate electrode having a third length along the first direction, wherein the second length is greater than the third length, and wherein outer edges of the interfacial layer, the high-k dielectric layer, and the gate electrode form a step profile;
    gate spacers having sidewall portions contacting sidewalls of the gate electrode and bottom portions contacting top portions of the high-k dielectric layer and the interfacial layer; and
    source/drain features disposed in the semiconductor layer adjacent to the HKMG.

15. The semiconductor structure of claim 14, further comprising a silicide layer wrapping around upper portions of the source/drain features.

16. The semiconductor structure of claim 15, further comprising an interlayer dielectric (ILD) layer disposed over the silicide layer and a source/drain contact disposed in the ILD layer to contact the silicide layer.

17. The semiconductor structure of claim 14, wherein sidewall portions of the gate spacers are free of the high-k dielectric layer.

18. The semiconductor structure of claim 16, wherein the silicide layer spans a first width along a second direction substantially perpendicular to the first direction and the source/drain contact spans a second width along the second direction, the first width being greater than the second width.

19. The semiconductor structure of claim 14, wherein a distance between an outer edge of the gate electrode and an outer edge of the high-k dielectric layer is less than a distance between the outer edge of the gate electrode and an outer edge of the interfacial layer.

20. The semiconductor structure of claim 14, wherein each sidewall of the gate electrode forms an acute angle with the high-k dielectric layer.

\* \* \* \* \*